(12) United States Patent
Kobayashi et al.

(10) Patent No.: US 8,580,907 B2
(45) Date of Patent: Nov. 12, 2013

(54) INSULATING FILM MATERIAL, MULTILAYER WIRING BOARD AND PRODUCTION METHOD THEREOF, AND SEMICONDUCTOR DEVICE AND PRODUCTION METHOD THEREOF

(75) Inventors: Yasushi Kobayashi, Kawasaki (JP); Yoshihiro Nakata, Kawasaki (JP); Shirou Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 180 days.

(21) Appl. No.: 12/648,804

(22) Filed: Dec. 29, 2009

(65) Prior Publication Data

US 2010/0140807 A1 Jun. 10, 2010

Related U.S. Application Data

(63) Continuation of application No. PCT/JP2008/058977, filed on May 15, 2008.

(51) Int. Cl.
*C08G 77/60* (2006.01)

(52) U.S. Cl.
USPC .............................................. 528/34; 528/35

(58) Field of Classification Search
USPC ..................................... 528/34, 35
See application file for complete search history.

(56) References Cited

U.S. PATENT DOCUMENTS

| 5,811,564 | A  | * | 9/1998 | Barnard et al. | 556/435 |
| 8,017,700 | B2 | * | 9/2011 | Nakagawa et al. | 525/474 |
| 2006/0063905 | A1 |  | 3/2006 | Nakagawa et al. | |
| 2007/0020467 | A1 | * | 1/2007 | Nakagawa et al. | 428/447 |
| 2007/0027287 | A1 |  | 2/2007 | Akiyama et al. | |
| 2007/0031687 | A1 |  | 2/2007 | Akiyama et al. | |
| 2008/0038527 | A1 | * | 2/2008 | Akiyama et al. | 428/219 |
| 2010/0168327 | A1 | * | 7/2010 | Akiyama et al. | 524/588 |

FOREIGN PATENT DOCUMENTS

| CN | 1954017 | A |   | 4/2007 |
| EP | 1947135 | A1 |   | 7/2008 |
| JP | 5-156176 | A |   | 6/1993 |
| JP | 2001-127152 | A |   | 5/2001 |
| JP | 2005-272816 | A |   | 10/2005 |
| JP | 2006-117917 | A |   | 5/2006 |
| JP | 2007-324283 | A |   | 12/2007 |
| WO | 2005/068540 |   | * | 7/2005 |
| WO | 2005/108469 |   | * | 11/2005 |
| WO | 2005/108469 | A1 |   | 11/2005 |
| WO | 2005/108516 |   |   | 11/2005 |
| WO | 2007-055097 |   | * | 5/2007 |
| WO | 2007/055097 | A1 |   | 5/2007 |

OTHER PUBLICATIONS

International Search Report of PCT/JP2008/058977, mailing date of Sep. 9, 2008.
Chinese Office Action Oct. 26, 2011, issued in corresponding Chinese Patent Application No. 200880023571.

* cited by examiner

*Primary Examiner* — Margaret Moore
(74) *Attorney, Agent, or Firm* — Westerman, Hattori, Daniels & Adrian, LLP

(57) ABSTRACT

An insulating film material, which contains a polycarbosilane compound expressed by the following structural formula 1:

Structural Formula 1

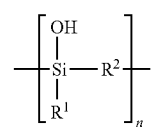

where $R^1$ may be the same or different to each other in the unit repeated "n" times, and each represents C1-4 hydrocarbon or aromatic hydrocarbon; $R^2$ may be the same or different to each other in the unit repeated "n" times, and each represents C1-4 hydrocarbon or aromatic hydrocarbon; n is an integer of 5 to 5,000.

3 Claims, 12 Drawing Sheets

INSULATING FILM MATERIAL, MULTILAYER WIRING BOARD AND PRODUCTION METHOD THEREOF, AND SEMICONDUCTOR DEVICE AND PRODUCTION METHOD THEREOF

CROSS-REFERENCE TO RELATED APPLICATIONS

This is a continuation application of PCT/JP2008/58977, filed on May 15, 2008. This application is based upon and claims the benefits of priorities of the prior International Application No. PCT/JP2007/063586, filed on Jul. 6, 2007, and the prior International Application No. PCT/JP2008/58977, filed on May 15, 2008, the entire contents of which are incorporated herein by reference.

FIELD

The embodiments discussed herein relate to a material for an insulating film, which is suitably usable for formation of an insulating film in a multilayer wirings of a semiconductor integrated circuit, a multilayer wiring board containing an insulating film formed using the material for an insulating film and a production method thereof, and a semiconductor device containing an insulating film formed using the material for an insulating film and a production method thereof.

BACKGROUND

A demand for multilayer semiconductor elements has recently increased following the increase in the degree of integration of semiconductor integrated circuits and the rise of element density. Because spacing between wirings further decreases as the degree of integration of semiconductor integrated circuits grows, wiring delay caused by the increase in capacitance between the wirings becomes a problem. Here, the wiring delay (T) is represented by the following formula: $T \propto CR$ and is, therefore, affected by a wiring resistance (R) and a capacitance (C) between wirings. The relationship between a dielectric constant ($\in$) and the capacitance (C) between wirings is represented by the following formula $C = \in_0 \in_r \cdot S/d$, where S is an electrode surface area of an electrode, $\in_0$ is a dielectric constant of vacuum, $\in_r$ is a dielectric constant of an insulating film, and d is a distance between wirings. Although the capacitance (C) between wirings can be decreased by reducing the wiring thickness and decreasing the electrode surface area, the decrease in wiring thickness causes additional increase in wiring resistance (R), thereby making it impossible to attain a high speed. Therefore, decreasing the dielectric constant of the insulating film is an effective means for reducing the wiring delay (T) and increasing speed.

There is a trend to decrease a spacing between metal wirings in semiconductor devices having a multilayer wiring structure. Accordingly, the impedance of metal wiring determined by electrostatic inductance increases, and the increase in delay of response speed and power consumption causes concerns. Therefore, it is necessary to reduce the specific permittivity of interlayer insulating film provided between a semiconductor substrate and a metal wiring or between metal wirings as much as possible.

Inorganic materials such as silicon dioxide ($SiO_2$), silicon nitride (SiN), and phosphosilicate glass (PSG), and organic polymer materials such as polyimides have been used as conventional materials for insulating films.

However, a dielectric constant of $CVD-SiO_2$ films that are widely used in semiconductor devices is as high as about 4. Further, a SiOF film that has been studied as a CVD film with a low dielectric constant has a dielectric constant of about 3.3 to about 3.5, but it has high hygroscopicity and the dielectric constant thereof increases with time.

It has recently been suggested to add an organic resin or the like that is evaporated or decomposed on heating to a material for forming a film with a low dielectric constant and to obtain a porous film in which pores are formed by heating during deposition. Because porous films have pores, a dielectric constant lower than that in the conventional configurations can be realized, but the problem that is presently associated with this approach is that the pore size is as large as 10 nm or more and where a porosity (pore presence ratio) is increased with the object of further decreasing the dielectric constant, moisture absorption causes increase in dielectric constant and decrease in film strength.

At present, a film is formed by applying a chemical solution so as to reduce a film density for the purpose of lowing the dielectric constant of the film, and as the chemical solution, those using a silicon compound have been known (see Japanese Patent Application Laid-Open (JP-A) No. 2001-127152). However, in the case where the silicon compound, especially polycarbosilane compound is used, there is a problem such that formation of a film is difficult. This is because the structure of the polycarbosilane compound is expressed by the following formula: (—Si—R—)n-, where R is an organic group containing at least one C, and has a similar structure to that of a hydrocarbon material in view of the environment for bonding, and thus the crosslinking does not progress. Therefore, it has been found that the obtained film is insufficient in terms of the strength thereof to serve as an insulating film used for a semiconductor device.

SUMMARY

According to an aspect of the invention, an insulating film material contains a polycarbosilane compound having a structure expressed by the following structural formula 1:

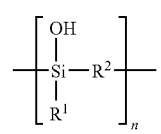

Structural Formula 1

In the structural formula 1, $R^1$ may be the same or different to each other in the unit repeated "n" times, and each represents C1-4 hydrocarbon or aromatic hydrocarbon; $R^2$ may be the same or different to each other in the unit repeated "n" times, and each represents C1-4 hydrocarbon or aromatic hydrocarbon; n is an integer of 5 to 5,000.

According to another aspect of the invention, a multilayer wiring board contains a substrate, and a multilayer wiring structure, which contains a plurality of wiring layer disposed above the substrate, and an insulating layer, wherein the wiring layers are electrically connected to each other, and the insulating film is a silicon-containing insulating film formed by using the aforementioned insulating film material and being exposed to a single ray or mixed rays of light.

According to another aspect of the invention, a method for producing a multilayer wiring board contains an interlayer insulating film forming step, that is forming an interlayer insulating film on a processing surface by using the aforementioned insulating film material, a wiring pattern forming step, that is etching the interlayer insulating film so as to form a wiring pattern, and a wiring layer forming step, that is forming a wiring layer using the wiring pattern, in which the interlayer insulating film forming step, the wiring pattern forming step, and the wiring layer forming step are repeated.

According to another aspect of the invention, a semiconductor device contains: a transistor; a semiconductor substrate on a surface of which the transistor is disposed; a multilayer wiring structure disposed on the semiconductor substrate; and an electrode pad disposed on an uppermost layer of the multilayer wiring structure, in which wherein the multilayer wiring structure contains a plurality of wiring layers disposed above the semiconductor substrate, and an interlayer insulating film disposed between the wiring layers, in which the wiring layers are electrically connected to each other through a through hole piercing through the interlayer insulating film, and the transistor and the electrode pad are electrically connected through the multilayer wiring structure, and in which the interlayer insulating film is formed by the aforementioned insulating film material.

In addition, according to another aspect of the invention, a semiconductor device contains: a transistor; a semiconductor substrate on a surface of which the transistor is disposed; a multilayer wiring structure disposed on the semiconductor substrate; and an electrode pad disposed on an uppermost layer of the multilayer wiring structure, in which the multilayer wiring structure contains a plurality of wiring layers disposed above the semiconductor substrate, an interlayer insulating film disposed between the wiring layers and either or both of an etching stopper film and a chemical mechanical polishing stopper film formed on the interlayer insulating film by using the aforementioned insulating film material, and in which the wiring layers are electrically connected to each other through a through hole piercing through the interlayer insulating film, and the transistor and the electrode pad are electrically connected through the multilayer wiring structure.

According to another aspect of the invention, a method for producing a semiconductor device contains a transistor forming step, that is forming a transistor on a surface of a semiconductor substrate, a multilayer wiring structure forming step, that is repeating an interlayer insulating film forming step, a wiring pattern forming step and a wiring layer forming step, and an electrode forming step, that is forming an electrode pad on the uppermost layer of the multilayer wiring structure. Here, the interlayer insulating film forming step is forming an interlayer insulating film on a processing surface by using the aforementioned insulating film material, the wiring pattern forming step is etching the interlayer insulating film so as to form a wiring pattern, and the wiring layer forming step is forming a wiring layer using the wiring pattern.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
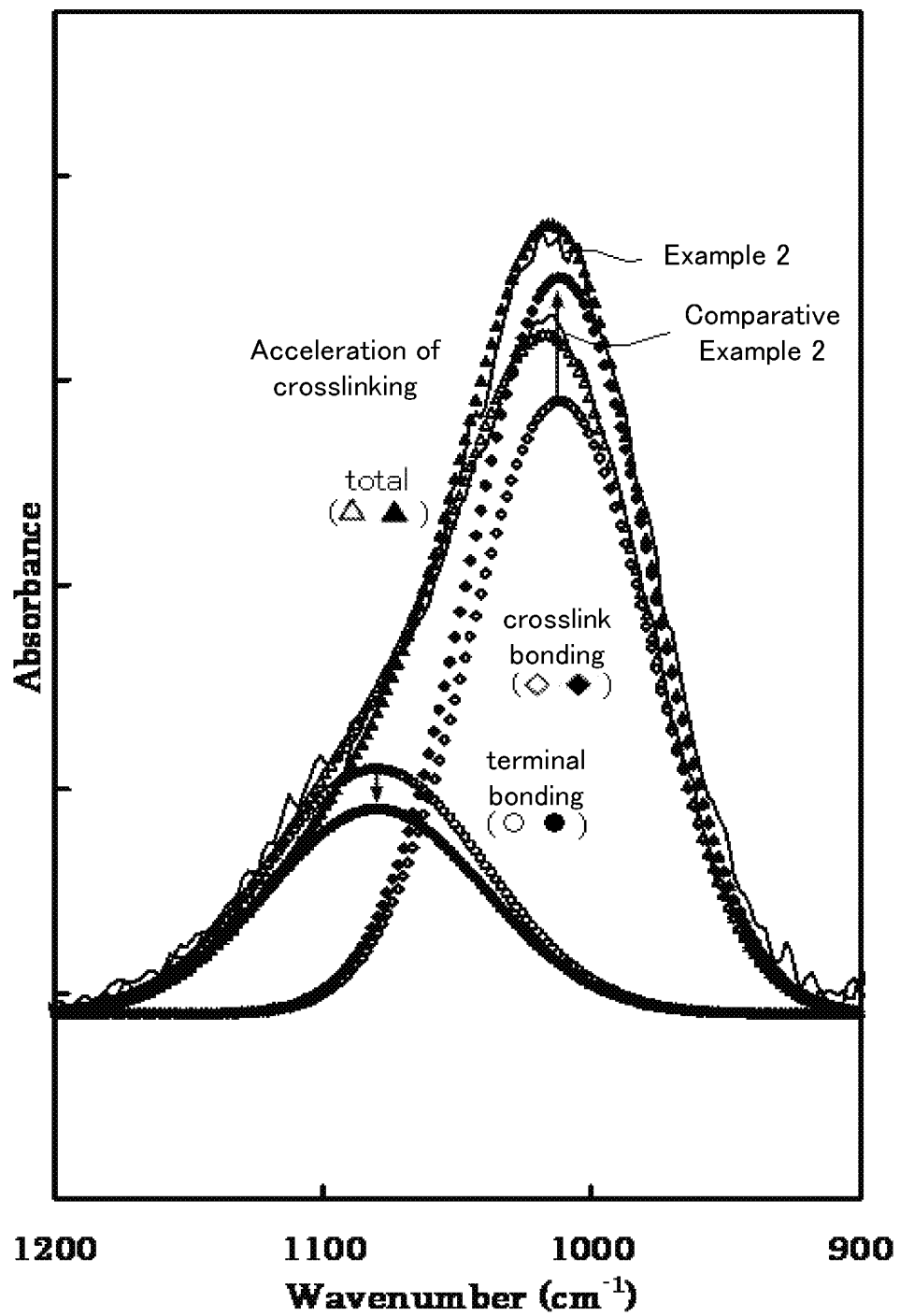
FIG. 1 is a graph exhibiting FT-IR spectrums of the insulating films obtained in Example 2 and Comparative Example 2.

The inventors have come to the following findings as a result of their diligent studies and researches.

A polycarbosilane compound having a silanol group(s) is synthesized by replacing a hydrogen atom of the Si—H bonding in the conventional polycarbosilane with a hydroxy group. Here, it has been found that the polycarbosilane becomes hydrophilic as a result of silanolization of carbosilane, easily mixed with a silane compound, which has been conventionally very difficult, and the properties and material composition of an insulating film is freely changeable depending on the type and addition amount of the silane compound to be mixed.

Moreover, it has been found that an insulating film of low dielectric constant and high strength is attained by adding the silane compound, preferably the silane compound containing a group having an unsaturated bonding. Furthermore, it has been found that an insulating film of high strength and low dielectric constant is attained by using an insulating film material containing a polycarbosilane compound containing a silanol group(s), as two hydroxyl groups are easily crosslinked to a siloxane bonding by a dehydration/condensation reaction, and crosslinking of the polycarbosilane compound is accelerated by the intentional dehydration/condensation reaction of the silanol group. Based upon these findings, the inventors have achieved the invention.

(Insulating Film Material)

The insulating film material contains a polycarbosilane compound expressed by the following structural formula 1, preferably further contains a silane compound, and optionally further contains a solvent and other substances.

Structural Formula 1

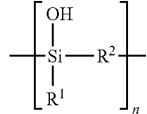

In the structural formula 1, $R^1$ may be the same or different to each other in the unit repeated "n" times, and each represents C1-4 hydrocarbon or aromatic hydrocarbon; $R^2$ may be the same or different to each other in the unit repeated "n" times, and each represents C1-4 hydrocarbon or aromatic hydrocarbon; n is an integer of 5 to 5,000.

—Polycarbosilane Compound—

The polycarbosilane compound is suitably selected depending on the intended purpose without any restriction, provided that it contains silanol groups and has the structure expressed by the structural formula 1. It is preferred that the polycarbosilane compound has a symmetric structure as an entire structure thereof. When an insulating film is formed using the polycarboxilane compound having a symmetric structure, uniform pores, which are large in size, are formed. Therefore, the film strength thereof can be maintained even when the porosity is increased.

Moreover, as the polycarbosilane compound contains silanol groups, the polycarbosilane compound has hydrophilicity, and thus can be easily mixed with another hydrophilic solvent or hydrophilic compound. Therefore, the polycarbosilane compound is easily mixed with a silane compound, which has conventionally been difficult to mix with the conventional polycarbosilane. Furthermore, as will be described later, the crosslinking of the polycarboxilane compound is accelerated by the dehydration/condensation reaction of the silanol groups, to thereby form an insulating film having a high physical strength.

In addition to the above, as the polycarbosilane compound contains the sufficient amount of hydrocarbon or aromatic hydrocarbon in the structure thereof, the etch selectivity between the obtained insulating film and a porous film can be sufficiently attained, and thus the polycarbosilane compound is suitably applicable for the formation of an insulating film used as an etching stopper film, a chemical mechanical polishing stopper film, or the like.

The method for confirming whether or not the polycarbosilane compound contains the structure expressed by the structural formula 1 is suitably selected depending on the intended purpose without any restriction. For example, it can be confirmed by the analysis of NMR.

The groups $R^1$ in the structural formula 1 is suitably selected depending on the intended purpose without any restriction, provided that they are the same or different each other in the unit repeated "n" times, and are each C1-4 hydrocarbon or aromatic hydrocarbon. Examples thereof include methyl group, ethyl group, propyl group, butyl group, vinyl group, and phenyl group. Among them, methyl group preferable, as it contributes to provide an insulating film of high physical strength as well as maintaining low dielectric constant thereof.

The groups $R^2$ in the structural formula 1 is suitably selected depending on the intended purpose without any restriction, provided that they are the same or different each other in the unit repeated "n" times, and are each C1-4 hydrocarbon or aromatic hydrocarbon. Examples thereof include $R^2$ methylene group, ethylene group, propylene group, isopropylene group, vinylene group, and phenylene group. Among them, methylene group is preferable, as it contributes to form fine pores relatively easily, and to provide an insulating film having low dielectric constant and high physical strength.

In the structural formula 1, n is an integer of 5 to 5,000. When n is an integer of less than 5, the polycarbosilane compound may be evaporated by the heating process in the presence of inert gas at the temperature of 50° C. to 400° C. in the course of the formation of an insulating film. When n is an integer of more than 5,000, the polycarbosilane compound loses solubility to a solvent and thus it may be difficult to form an insulating film by spin coating.

The weight average molecular weight of the polycarbosilane compound is suitably adjusted depending on the intended purpose without any restriction. The weight average molecular weight thereof is preferably more than 400, but 10,000 or less.

When the weight average molecular weight thereof is 400 or less, the polycarbosilane compound dissolved in the solvent may be evaporated at the time when an insulating film is formed by coating. As a result, it is difficult to form an insulating film, and also the sufficient film strength thereof may not be attained. When the weight average molecular weight thereof is more than 10,000, the coating liquid formed by dissolving the polycarbosilane compound in the solvent has high viscosity, lowering the coating performance, and increasing the dielectric constant of the resulted film.

The method for measuring the weight average molecular weight is suitably selected depending on the intended purpose without any restriction. For example, it can be measured by gel permeation chromatography (GPC).

The amount of silanol groups in the polycarbosilane compound expressed by the structural formula 1 is suitably adjusted depending on the intended purpose without any restriction. It is preferably 1% by mass to 20% by mass, more preferably 7% by mass to 18% by mass. Here, the amount of the silanol groups is calculated by the following formula:

The amount of the solanol groups=[Si—OH]/Weight average molecular weight of polycarbosilane compound×100

In the formula above, [Si—OH] represents the mass of OH contained as Si—OH.

When the amount of the silanol groups is less than 1% by mass, the obtained insulating film may be poor in the physical strength thereof. When the amount of the silanol groups is more than 20% by mass, any additional effect is not attained by the addition of the large amount of the silanol groups, lowing the physical strength of the insulating film, increasing the dielectric constant thereof.

The method for synthesizing the polycarbosilane compound expressed by the structural formula 1 is suitably selected depending on the intended purpose without any restriction. For example, it can be carried out by replacing the hydrogen atoms of Si—H bondings contained in polycarbosilane with hydroxyl groups. As a result, the polycarbosilane compound to which silanol groups are introduced is obtained.

It is preferred that an oxidation catalyst be used for the synthesis of the polycarbosilane compound. Such oxidation catalyst is suitably selected depending on the intended purpose without any restriction, provided that it has an oxidative effect. Suitable examples thereof include ozone, manganese dioxide, chlorine, nitric acid, hot concentrated sulfuric acid, hydrogen peroxide, potassium permanganate, potassium dichromate, copper chloride, silver oxide, sulfur dioxide, osmium tetroxide, tetrapropylammonium perruthenate, tetrapropylammonium hydroxide, tetra-n-butylammonium hydroxide, tetramethylammonium hydroxide, N-methylmorpholine N-oxide, and tetrabutylhydroperoxide.

The amount of the polycarbosilane compound expressed by the structural formula 1 contained in the insulating film material is suitably adjusted depending on the intended purpose without any restriction. It is preferably 1% by mass to 40% by mass, more preferably 5% by mass to 20% by mass.

When the amount thereof is less than 1% by mass, the obtained insulating film may be poor in the physical strength thereof. When the amount thereof is more than 40% by mass, the insulating film may have large variations in the thickness thereof.

—Silane Compound—

It is advantageous that the insulating film material further contains the silane compound as the insulating film obtained from such insulating film material can enhance the film strength thereof. The addition of the silane compound is effective for the insulating film material to serve as an interlayer insulating film within a multilayer wiring.

The silane compound is suitably selected depending on the intended purpose without any restriction. For the reason that it is easily form a bonding with the polycarbosilane compound expressed by the structural formula 1, the silane compound preferably contains at least one selected from the group consisting of alkoxy group, silazane bonding, chloro group, alkylamino group, and hydroxide group.

The silane compound containing the alkoxy group is suitably selected depending on the intended purpose without any restriction. Examples thereof include acetoxymethyldimethylacetosilane, acetoxymethyltriethoxysilane, acetoxymethyltrimethoxysilane, acetoxytrimethylsilane, allyloxytrimethylsilane, allyltriethoxysilane, allyltrimethoxysilane, 4-aminobutyltriethoxysilane, 4-aminobutyltrimethoxysilane, bis(triethoxysilyl)methane, bis(triethoxysilyl)ethylene, bis(trimethoxysilyl)ethane, bis(trimethoxysilyl)hexane, bromophenyltrimethoxysilane, chloromethylmethylthethoxysilane, chloromethyl triethoxysilane, chloromethyltrimethoxysilane, 3-chloropropyltriethoxysilane, 3-chloropropyltrimethoxysilane, cyclohexylethyldimethoxysilane, cyclohexylmethyldimethoxysilane, cyclohexyltrimethoxysilane, cyclopentyltrimethoxysilane, diethoxydivinylsilane, 1,3-dimethyltetramethoxydisiloxane, diphenyldiethoxysilane, 1,3-divinyltetraethoxydisiloxane, hexamethoxydisilane, n-hexyltriethoxysilane, mercaptomethylmethyldiethoxysilane, mercaptomethyltrimethoxysilane, methyldiethoxysilane, methyldimethoxysilane, methyltriethoxysilane, methyltrimethoxysilane, pentafluorophenylpropyltrimethoxysilane, phenyldiethoxysilane, phenyldimethylethoxysilane, phenyltriethoxysilane, phenyltrimethoxysilane, tetraethoxysilane, tetramethoxysilane, triethoxyfluorosilane, triethoxysilane, vinylmethyldiethoxysilane, vinyltriethoxysilane, vinyltrimethoxysilane, vinylmethyldiethoxysilane, vinylphenyldiethoxysilane, and trivinylethoxysilane. These may be used independently or in combination.

The silane compound containing the silazane bonding is suitably selected depending on the intended purpose without any restriction. Examples thereof include di-n-butyltetramethyldisilazane, 1,3-divinyltetramethyldisilazane, hexamethyldisilazane, 1,1,3,3-tetramethyldisilazane, and 1,1,3,3-tetraphenyldimethyldisilazane. Moreover, other silane compounds may be used provided that they at least contain nitrogen, and examples of such compounds include bis(trimethylsily)urea, 2,2,5,5-tetramethyl-2,5-disila-1-azacyclopentane, and N-(trimethylsilyl)acetoamide. These may be used independently or in combination.

The silane compound containing the chloro group is suitably selected depending on the intended purpose without any restriction. Examples thereof include trimethylchlorosilane, dimethyldichlorosilane, methyltrichlorosilane, triethylchlorosilane, diethyldichlorosilane, ethyltrichlorosilane, 4-[2-(trichlorosilyl)ethyl]pyridine, and (N,N-dimethylamino)dimethylchlorosilane. These may be used independently or in combination.

The silane compound containing the alkylamino group is suitably selected depending on the intended purpose without any restriction. Examples thereof include (N,N-dimethylamino)dimethylchlorosilane, (N,N-dimethylamino)dimethylsilane, trimethylsilydimethylamine, trimethylsilylthethylamine, triethylsilyldimethylamine, trimethylsilylthethylamine, dimethylaminomethylethoxysilane, and bis(dimethylamino)diphenylsilane. These may be used independently or in combination.

The silane compound containing the hydroxide group is suitably selected depending on the purpose without any restriction, provided that it holds hydroxide group in the solvent. Examples thereof include 1,4-bis(hydroxydimethylsilyl)benzene, t-butyldimethylsilanol, diphenylsilanediol, triethylsilanol, 2-(trimethylsilyl)ethanol, triphenylsilanol, and sodium methylsiliconate. These may be used independently or in combination.

Moreover, the silane compound may contain the compounds expressed by the following general formulae 1 to 3:

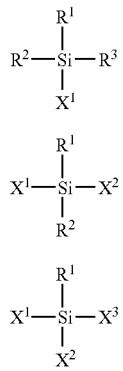

General Formula 1

General Formula 2

General Formula 3

In the general formulae 1 to 3, $R^1$, $R^2$ and $R^3$ are each hydrogen, C1-4 aliphatic hydrocarbon group, C6-8 aromatic hydrocarbon group which may contain a substituent, or C4-8 heteroaromatic group which may contain a substituent, and $X^1$, $X^2$ and $X^3$ are each chloro group, hydroxyl group, C1-3 alkoxy group, or C1-4 alkylamino group, provided that at least one of $R^1$, $R^2$ and $R^3$ contains a group having at least one unsaturated bonding. The group having an unsaturated bonding is not particularly restricted, and can be appropriately selected, for example from unsaturated hydrocarbon group, aromatic hydrocarbon group, heteroaromatic group known in the art. Specific examples of such group having an unsaturated bonding include vinyl group, acroyl group, benzyl group, phenyl group, carbonyl group, carboxyl group, diazo group, azide group, cinnamoyl group, acrylate group, cinnamylidene group, cyanocinnamylidene group, furylpentandiene group, p-phenylenediacrylate group, and pyridinyl group. Among them, vinyl group, phenyl group, and pyridinyl group are preferable, as a chemical reaction is rapidly induced with these groups by light exposure. Moreover, there is no specific limitation for the number of the group containing an unsaturated bonding contained in one molecule.

Moreover, the silane compound may contain a nitrogen-interpositioned compound, which is formed from at least two compounds selected from the group consisting of compounds expressed by the following general formulae 1 to 3 by removing at least one of $X^1$, $X^2$ and $X^3$ in each compound and connecting these compounds with a nitrogen atom.

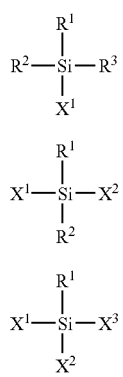

General Formula 1

General Formula 2

General Formula 3

In the general formulae 1 to 3, $R^1$, $R^2$ and $R^3$ are each hydrogen, C1-4 aliphatic hydrocarbon group, C6-8 aromatic hydrocarbon group which may contain a substituent, or C4-8 heteroaromatic group which may contain a substituent, and $X^1$, $X^2$ and $X^3$ are each chloro group, hydroxy group, C1-3 alkoxy group, or C1-4 alkylamino group, provided that at least one of $R^1$, $R^2$ and $R^3$ contains a group having at least one unsaturated bonding. The group having an unsaturated bonding is as mentioned above.

The nitrogen-interpositioned compound preferably contains a compound expressed by any of the following general formulae 4 to 7:

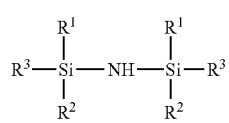

General Formula 4

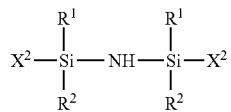

General Formula 5

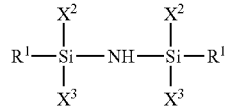

General Formula 6

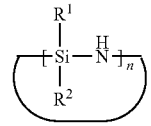

General Formula 7

In the general formulae 4 to 7, $R^1$, $R^2$ and $R^3$ are each hydrogen, C1-4 aliphatic hydrocarbon group, C6-8 aromatic hydrocarbon group which may contain a substituent, or C4-8 heteroaromatic group which may contain a substituent, $X^1$, $X^2$ and $X^3$ are each chloro group, hydroxy group, C1-3 alkoxy group, or C1-4 alkylamino group, and n is an integer of 3 to 5, provided that at least one of $R^1$, $R^2$ and $R^3$ contains a group having at least one unsaturated bonding.

The amount of the silane compound contained in the insulating film material is suitably selected depending on the intended purpose without restriction. The amount thereof is preferably 20% by mass to 70% by mass, more preferably 30% by mass to 60% by mass.

When the amount thereof is less than 20% by mass, the effect for enfancing the film strength of the insulating film may not be addition with an addition of the silane compound. When the amount thereof is more than 70% by mass, the dielectric constant of the insulating film may be increased.

—Solvent—

The solvent is suitably selected depending on the intended purpose without any restriction, provided that the solvent is capable of dissolving the polycarbosilane compound expressed by the structural formula 1. Examples thereof include water, methanol, ethanol, propanol, cyclohexane, acetone, methylisobutyl ketone, methylethyl ketone, methylcellosolve, ethylcellosolve, octane, decane, hexane, propylene glycol, propylene glycol monomethylether acetate, dioxane, diethylether, diethylene glycol, dimethyl sulphate, propylene glycol monomethylether, propylene glycol monoethylether, propylene glycol monopropylether, and tetrahydrofuran. These may be used independently or in combination.

The amount of the solvent in the insulating film material is appropriately selected depending on the amount of the polycarbosilane compound expressed by the structural formula 1, the amount of the silane compound, and the like.

—Other Substances—

The aforementioned other substances are suitably selected depending on the intended purpose without any restriction, provided that they do not adversely affect the effect obtainable by the insulating film material. Examples thereof include metal alkoxide, and various additives known in the art.

The metal alkoxide is suitably selected depending on the intended purpose without any restriction. Examples thereof include diethyldiethoxygermane, ethyltriethoxygermane, methyltriethoxygermane, tetraethoxygermane, tetramethoxygermane, triethylmethoxygermane, di-n-butyldimehthoxytin, aluminum ethoxide, antimony ethoxide, antimony methoxide, arsenic triethoxide, boron ethoxide, boron methoxide, calcium ethoxide, calcium methoxide, gallium ethoxide, tetraethoxygermane, tetramethoxygermane, hafnium ethoxide, iron ethoxide, magnesium ethoxide, manganese methoxide, molybdenum ethoxide, niobium ethoxide, potassium ethoxide, potassium methoxide, sodium ethoxide, strontium isopropoxide, tantalum ethoxide, tantalum methoxide, tellurium ethoxide, tin ethoxide, tin methoxide, titanium butoxide, titanium ethoxide, titanium methoxide, tungsten ethoxide, vanadium tripropoxide, yttrium isopropoxide, and zirconium ethoxide.

The amount of the aforementioned other substances contained in the insulating film material is appropriately selected depending on the amount of the polycarbosilane compound expressed by the structural formula 1, the type or amount of the solvent, and the like.

Since the insulating film material contains the polycarbosilane compound expressed by the structural formula 1, it is possible to form an insulating film of low dielectric constant and high film strength, and such insulating film material is suitably used for the formations of the following multilayer wiring board, semiconductor device, and the like.

Moreover, as the insulating film material contains the polycarbosilane compound expressed by the structural formula 1 and the polycarbosilane compound contains a silanol group(s), when such the insulating film material is used for formation of an insulating film, an insulating film of high strength and low dielectric constant is attained by accelerating the crosslinking of the polycarbosilane compound as a result of the intentional dehydration/condensation reaction of the silanol group(s). Therefore, the insulating film formed using the insulating film material is used as an interlayer insulating film, an etching stopper film, a chemical mechanical polishing stopper film (a CMP stopper film), and the like, is suitably usable for formation of a multilayer wiring, is suitably usable for productions of various semiconductor devices, and is particularly suitable for productions of the multilayer wiring board and semiconductor device of the invention.

It has been known that there is a case where the signal transmission speed is reduced due to the parasitic capacitance of the insulating film, but the wiring delay has not affected to the entire device for the generation of the semiconductor device each having a wiring space of 1 μm or more. However, in recent years, along with the trends for the highly integrated semiconductor integrated circuits having multilayer wiring structure, the wiring width and space are narrowed. As a result, the parastic capacitance between the wiring is largely affect the speed of the device if the circuit is formed at the wiring space of 1 μm or less, especially 0.1 μm or less in the future.

Currently, a film formed of a silicon compound formed by plasma is mainly used depending on the purpose thereof for a multilayer wiring structure of a semiconductor device. However, the film formed of the silicon compound by plasma has an extremely dense structure and high film strength, but has high dielectric constant, which can be a problem.

The insulating film formed by using the aforementioned insulating film material has low dielectric constant and high strength, and contributes high-speed response, and moreover realizes lowering of the parasitic capacitance between the wiring to thereby achieve high speed signal transmission.

(Multilayer Wiring Board)

The multilayer wiring board at least contains a substrate and a multilayer wiring structure, and optionally further contains arbitrarily selected other members (a film and/or layer).

—Substrate—

The substrate is suitably selected depending on the intended purpose without any restriction in terms of the shape, structure, size, and material thereof. The substrate is preferably a resin substrate, and suitable examples thereof include a glass epoxy substrate, a polyester substrate, a polyimide substrate, a bismaleimide-triazine resin substrate, a thermosetting polyphenylene ether substrate, a fluororesin substrate, and a ceramic substrate.

—Multilayer Wiring Structure—

The multilayer wiring structure contains a plurality of wiring layers disposed on the substrate, and a single or plurality of interlayer insulating films disposed between the wiring layers, and the wiring layers are electrically connected to each other via a through-hole piercing through the interlayer insulating film(s).

—Wiring Layer—

The wiring layer is suitably selected depending on the intended purpose without any restriction in terms of the material, shape, structure, and thickness thereof.

A plurality of the wiring layers are laminated with the inter layer insulating film(s) intervening therebetween. The number of the layer laminated is suitably selected depending on the intended purpose without any restriction, and it is preferably 4 or more as the integration density is improved.

Moreover, the wiring layers are electrically connected to each other via a through hole (or a via-hole) formed in the interlayer insulating film(s).

—Interlayer Insulating Film—

The interlayer insulating film is formed of the aforementioned insulating film material.

The method for forming the interlayer insulating film is suitably selected depending on the intended purpose without any restriction. For example, it is formed by coating a processing surface with the aforementioned insulating film material.

The processing surface is suitably selected depending on the intended purpose without any restriction. For example, the processing surface is a surface of a substrate or a surface of an insulating film other than the aforementioned interlayer insulating film. Specific examples thereof include a surface of a substrate such as a silicon wafer, and surfaces of various oxide films.

The coating method is suitably selected depending on the intended purpose without any restriction. Examples thereof include spin coating, dip coating, kneader coating, curtain coating, and blade coating. Among them the spin coating is preferable in view of the coating efficiency. In the case of the spin coating, as the conditions thereof are for example, the rotation number is about 100 rpm to about 10,000 rpm, preferably 800 rpm to 5,000 rpm, and the duration is about 1 second to about 10 minutes, preferably 10 seconds to 90 seconds.

The various characteristics of the interlayer insulating film, such as the shape, structure, and size thereof, are suitably selected depending on the intended purpose without any restriction. The interlayer insulating film preferably has the thickness, dielectric constant and film strength mentioned below.

The shape of the interlayer insulating film is suitably selected depending on the intended purpose without any restriction, and examples thereof include a flat film shape, and a patterned shape.

The structure of the interlayer insulating film is suitably selected depending on the intended purpose without any restriction, and for example, it may be a single-layered structure or a laminated structure.

In the case where the interlayer insulating film has the patterned shape and the laminated structure, each pattern and each layer may have the same dielectric constant to the others or different dielectric constant from the others.

The size of the interlayer insulating film is suitably selected depending on the intended purpose without any restriction, and is preferably a size corresponding to the existing multi-layer wiring board.

The thickness of the interlayer insulating film is suitably selected depending on the intended purpose without any restriction. For example, the thickness thereof is generally 10 nm to 1 μm, preferably 10 nm to 500 nm, more preferably 10 nm to 300 nm in the multilayer wiring board in view of the structure thereof.

When the thickness thereof is less than 10 nm, the structural failure such as a pin hole may be caused. When the thickness thereof is more than 500 nm, especially at the time of the processing by dry etching, the selective etching ratio thereof with the resist pattern tends to be difficult to attain.

The dielectric constant is suitably selected depending on the intended purpose without any restriction, but the lower is more preferable. Specifically, the dielectric constant of the interlayer insulating film is preferably 3.0 or less, more preferably 2.8 or less.

The dielectric constant of the interlayer insulating film can be measured, for example, by forming a gold electrode on the interlayer insulating film and measuring by means of a dielectric constant measuring device.

The film strength of the interlayer insulating film is suitably selected depending on the intended purpose without any restriction. The film strength thereof is preferably 5 GPa or more, more preferably 10 GPa or more.

When the film strength thereof is less than 5 GPa, the strength is insufficient, and thus there may be a case where such interlayer insulating film cannot be applied for the multilayer wiring board.

The method for measuring the film strength is suitably selected depending on the intended purpose without any restriction. For example, it can be measured by using a nano indentation measuring device.

Another embodiment of the multilayer wiring board is preferably the one having the multilayer wiring structure that has a etching stopper film, or a chemical mechanical polishing stopper film (a CMP stopper film) formed of the aforementioned insulating film material on the interlayer insulating film formed of the aforementioned insulating film material and/or a conventional interlayer insulating film such as a porous silica film. In this case, the etching stopper film and the CMP stopper film formed of the insulating film material containing the polycarbosilane compound expressed in the structural formula 1 has low dielectric constant and high film strength, and thus it is easy to form a fine pattern.

The physical properties of the etching stopper film and the CMP stopper film are preferably the same as those of the aforementioned interlayer insulating film.

Since the multilayer wiring board contains the multilayer wiring structure containing at least one (insulating film) of the insulating film of lower dielectric constant, reduced parastic capacitance and desirable damage resistance formed by using the aforementioned insulating film material, the etching stopper film, and CMP stopper film, the high-speeded single transmission is realized, and the multilayer wiring board is particularly suitable for semiconductor integrated circuits of high integration degree such as IC and LSI, which appreciate the high speed response.

Although it is possible to produce the aforementioned multilayer wiring board in accordance with the method known in the art, it is suitably produced by the method for producing a multilayer wiring board mentioned below.

—Method for Producing Multilayer Wiring Board—

The method for forming a multilayer wiring board contains a repetition of an interlayer insulating film forming step, a wiring pattern forming step, a wiring layer forming step, preferably further contains an etching stopper film forming step, and a chemical mechanical polishing stopper film forming step, and optionally further contains suitably selected other steps.

<Interlayer Insulating Film Forming Step>

The interlayer insulating film forming step is forming an interlayer insulating film on a processing surface using the aforementioned insulating film material.

The processing surface is suitably selected depending on the intended purpose without any restriction. For example, the processing surface is a surface of a substrate or a surface of an insulating film other than the aforementioned interlayer insulating film. Specific examples thereof include a surface of a substrate such as a silicon wafer, and surfaces of various oxide films.

The method for forming the interlayer insulating film is suitably selected depending on the intended purpose without any restriction. Suitable examples thereof include coating.

The coating method is suitably selected depending on the intended purpose without any restriction. Examples thereof include spin coating, dip coating, kneader coating, curtain coating, and blade coating. Among them the spin coating is preferable in view of the coating efficiency. In the case of the spin coating, as the conditions thereof are for example, the rotation number is about 100 rpm to about 10,000 rpm, preferably 800 rpm to 5,000 rpm, and the duration is about 1 second to about 10 minutes, preferably 10 seconds to 90 seconds.

During the interlayer insulating film forming step, it is preferable that a heat treatment is carried out after forming the interlayer insulating film (coating with the insulating film material). In this case, oxidation of hydrocarbon or aromatic hydrocarbon contained in the polycarbosilane compound expressed by the structural formula 1 can be suppressed.

The conditions of the heating treatment (baking), such as temperature, and atmosphere thereof are suitably selected depending on the intended purpose. The temperature is preferably 50° C. to 400° C., more preferably 80° C. to 350° C.

When the temperature is less than 50° C., the solvent is remained within the film, and thus there may be a case where a sufficient film strength cannot be attained. When the temperature is more than 400° C., Si—C bonding in the polycarbosilane compound expressed by the structural formula 1 may be broken down.

The atmosphere is preferably inert gas, reduced atmosphere, or the like because use of the atmospheric air is concerned in terms of an increase in dielectric constant due to uptake of oxygen from the atmospheric air. Preferable examples of the inert gas include nitrogen.

Moreover, the interlayer insulating film (a silicon-containing insulating film) may be exposed to a single ray or mixed rays of light after forming the interlayer insulating film using the aforementioned insulating film material.

The light used for the exposure is not particularly restricted provided that it is capable of inducing photopolymerization by reacting the groups each having an unsaturated bonding under reduced pressure or atmospheric pressure. Examples thereof include ultraviolet ray (UV), electron ray, laser beam, X ray, and microwave. Among them, the ultraviolet ray or electron ray is preferable. It is preferred that ultraviolet ray be transmitted in vacuum in view of the exposure efficiency, but it may be arbitrarily selected as necessary.

The ultraviolet ray is classified into UV-A having a wavelength of 315 nm to 400 nm, UV-B having a wavelength of 280 nm to 315 nm, UV-C having a wavelength of 200 nm to 280 nm, and VUV (Vacuum Ultra Violet) having a wavelength of 10 nm to 200 nm. The ultraviolet ray used for the exposure may be any of them, but UV-C is particularly preferable because UV-C realizes highly efficient exposure in wide range, and a short processing duration. Note that, at the time of the exposure, inert gas such as nitrogen or argon may be supplied to adjust the pressure or for the property modification. Moreover, the exposure may be carried out while the interlayer insulating film is heated in a single step or plurality of steps within the temperature range of 400° C. or less. The heating is performed to accelerate the photopolymerization reaction and process within a short period of time, but it is arbitrarily selected as necessity.

By the step mentioned above, the interlayer insulating film is formed on the processing surface using the insulating film material.

<Wiring Pattern Forming Step>

The wiring pattern forming step is etching the interlayer insulating film so as to form a wiring pattern.

The wiring pattern is formed by forming, for example a resist film using a conventional resist material on the interlayer insulating film, performing selective exposure and developing to the resist film so as to form a desired pattern, and etching the interlayer insulating film using the pattern.

The method of the etching is suitably selected depending on the intended purpose without any restriction. It may be dry etching or wet etching. Preferable examples thereof include a plasma treatment, and an application of chemical solution.

By the step mentioned above, the wiring pattern is formed.

<Wiring Layer Forming Step>

The wiring layer forming step is forming a wiring layer using the wiring pattern.

The formation of the wiring layer can be carried out, for example by coating a space portion in the wiring pattern, which is formed by etching the interlayer insulating film, with a conductor that is a wiring precursor.

The coating with the conductor is carried our by a conventional plating method, such as commonly used plating, e.g. electroless plating and electroplating.

By the step mentioned above, the wiring is formed.

Then, by repeating a serious of steps, the interlayer insulating film forming step, the wiring pattern forming step, and the wiring layer forming step, a multilayer wiring board having high integration density of circuit can be produced.

<Etching Stopper Film Forming Step>

The etching stopper film forming step is forming an etching stopper film on the interlayer insulating film using the aforementioned insulating film material, and it is preferred that etching be performed using the obtained etching stopper in the wiring pattern forming step.

The formation of the etching stopper film is carried out in the same manner as in the interlayer insulating film step. Moreover, as the obtained etching stopper film is formed of the insulating film material, it has high film strength and can easily form fine pattern (wiring pattern).

<Chemical Mechanical Polishing Stopper Film Forming Step>

The chemical mechanical polishing stopper film (CMP stopper film) forming step is forming a CMP stopper film on the interlayer insulating film obtained in the last interlayer insulating forming step, using the aforementioned insulating film material, and it is preferred that a chemical mechanical polishing be performed on the outer surface of the formed multilayer wiring structure, after the last wiring layer forming step.

The formation of the CMP stopper film is carried out in the same manner as in the interlayer insulating film step. Moreover, as the obtained CMP stopper film is formed of the insulating film material, it has high film strength and can protect the interlayer insulating film at the time of the chemical mechanical polishing.

The method for producing a multilayer wiring board is suitably used for the productions of various multilayer wiring boards, but is particularly suitably used for the production of the multilayer wiring board of the aforementioned embodiment.

In the method for producing a multilayer wiring board, the interlayer insulating film is formed on a processing surface by using the aforementioned insulating film material in the interlayer insulating film forming step, the interlayer insulating film is etched to form the wiring pattern in the wiring pattern forming step, the wiring layer is formed using the wiring pattern in the wiring layer forming step, and these steps are carried out repeatedly.

(Semiconductor Device)

The semiconductor device contains at least a semiconductor substrate, a transistor, a multilayer wiring structure, and an electrode pad, and optionally further contains suitably selected other members.

—Semiconductor Substrate and Transistor—

The semiconductor substrate is suitably selected depending on the intended purpose without any restriction for the shape, structure, size and thickness thereof.

The transistor is formed on a surface of the semiconductor substrate. The transistor is suitably selected depending on the intended purpose without any restriction, and preferable examples thereof include a MOS transistor.

—Multilayer Wiring Structure—

The multilayer wiring structure is formed on the semiconductor substrate, and contains a plurality of wiring layers, and a single or plurality of interlayer insulating films disposed between the wiring layers, and the wiring layers are electrically connected to each other via a through-hole piercing through the interlayer insulating film(s). In addition, the interlayer insulating film is formed using the aforementioned insulating film material.

Note that, the multilayer wiring structure is the same as the multilayer wiring structure in the multilayer wiring board of the aforementioned embodiment, and the details thereof are as mentioned earlier.

Moreover, another embodiment thereof is preferably the multilayer wiring structure having an etching stopper film, or a chemical mechanical polishing stopper film (a CMP stopper film) formed of the aforementioned insulating film material on the interlayer insulating film formed of the aforementioned insulating film material and/or a conventional interlayer insulating film such as a porous silica film. In this case, the etching stopper film and the CMP stopper film formed of the insulating film material containing the polycarbosilane compound expressed in the structural formula 1 has low dielectric constant and high film strength, and thus it is easy to form a fine pattern.

—Electrode Pad—

The electrode pad is disposed on the uppermost layer of the multilayer wiring structure. Moreover, the electrode pad is electrically connected with the transistor via the multilayer wiring structure.

The electrode pad is suitably selected depending on the intended purpose without any restriction in terms of the shape, structure, and size thereof, provided that it has a function to electrically connect the wirings of the semiconductor device with leads or the like.

Since the semiconductor device contains the multilayer wiring structure containing at least one of the interlayer insulating film, etching stopper film, and chemical mechanical polishing stopper film which are of low dielectric constant and of high film strength and is formed by using the aforementioned insulating film material, the lowering of the parasitic capacitance between the wiring and lowing of the wiring resistance are realized, and such the semiconductor device attains high reliability at high speed. Therefore, it is particularly suitable for a flash memory, DRAM, FRAM, and MOS transistor.

Although it is possible to produce the aforementioned semiconductor device in accordance with the method known in the art, it is suitably produced by the method for producing a semiconductor device described below.

(Method for Producing Semiconductor Device)

The method for producing a semiconductor device contains at least a transistor forming step, a multilayer wiring structure forming step, and an electrode pad forming step, and optionally further contains suitably selected other steps.

<Transistor Forming Step>

The transistor forming step is forming a transistor on a surface of a semiconductor substrate.

The formation of the transistor may be carried out, for example, by forming a drain region and a source region on a surface of a silicone substrate, and disposing a gate electrode on a channel region placed between the drain region and the source region with a silicon oxide film intervening between the gate electrode and the channel region.

By the step mentioned above, the transistor is formed on the surface of the semiconductor substrate.

<Multilayer Wiring Structure Forming Step>

The multilayer wiring structure forming step is repeating an interlayer insulating film forming step, a wiring pattern forming step, and a wiring forming step so as to form a multilayer wiring structure.

Note that, the interlayer insulating film forming step, the wiring pattern forming step, and the wiring forming step are the same as the respective steps in the aforementioned method for producing a multilayer wiring board, and details thereof are as described earlier.

Moreover, the multilayer wiring structure forming step preferably further contains an etching stopper film forming step and a chemical mechanical polishing stopper film (CMP stopper film) forming step.

The etching stopper film forming step is forming an etching stopper film on the interlayer insulating film using the aforementioned insulating film material.

The CMP stopper film forming step is forming a CMP stopper film on the interlayer insulating film obtained in the last interlayer insulating forming step, using the aforementioned insulating film material.

These steps are respectively the same to the etching stopper film forming step and the CMP stopper film forming step of the aforementioned method for producing a multilayer wiring board, and details thereof are as mentioned earlier.

By the step mentioned above, the multilayer wiring structure is formed on the semiconductor substrate.

<Electrode Pad Forming Step>

The electrode pad forming step is forming an electrode pad on the uppermost layer of the multilayer wiring structure.

The formation method of the electrode pad is suitably selected from the methods known in the art without any restriction.

The position for forming the electrode pad is suitably selected depending on the intended purpose without any restriction, provided that it is on the uppermost layer of the multilayer wiring structure and with such position, the electrode pad is capable of being electrically connected to the transistor.

By the step mentioned above, the electrode pad is formed on the uppermost layer of the multilayer wiring structure, to thereby obtain a semiconductor device of the present embodiment.

In the method for producing a semiconductor device, the transistor is formed on the surface of the semiconductor device in the transistor forming step, the multilayer wiring structure is formed by repeating the interlayer insulating film step in which the interlayer insulating film is formed on the processing surface by using the aforementioned insulating film material, the wiring pattern forming step in which the wiring pattern is formed by etching the interlayer insulating film, and the wiring layer forming step in which the wiring layer is formed using the wiring pattern, and the electrode pad is formed on the uppermost layer of the multilayer wiring structure in the electrode forming step.

The aforementioned method for producing a semiconductor device is preferably used for the production of the aforementioned semiconductor device, realizes the lowing of the parasitic capacitance between wirings and the lowing of the wiring resistance, and efficiently produces a semiconductor device capable of speeding up a signal transmission, and having high performance.

EXAMPLES

Hereinafter, the examples of the present invention will be specifically explained, but these examples shall not be construed as to limit the scope of the present invention.

Example 1

—Preparation of Insulating Film Material—

A reaction vessel was charged with 10 g of polycarbosilane (NIPSI-L, manufactured by Nippon Carbon Co., Ltd.; weight average molecular weight of approximately 400), 60 g (0.6 mol) of methylisobutylketone, and 9 g (0.2 mol) of ethanol. Into the reaction vessel, 10 g of 60% by mass to 61% by mass nitric acid water (0.1 mol in water) was dropped through a dropping funnel at the condition of 2 mL/min. at the constant temperature of 60° C., and after the completion of the dropping, the mixture was reacted to mature for 7 hours. Thereafter, using a separating funnel, the reaction product was made dissolve in diethylether, added with a large amount of water and sodium hydrogen carbonate, and washed with water until the pH value became 5, to thereby remove excessive nitric acid. After the dropping, for the purpose of removing the water used for the removal of nitric acid, 200 mL of methylisobutylketone was added, and diethylether was removed by a rotary evaporator until the volume of the reaction solution became 100 mL, to thereby prepare an insulating film material.

—Formation of Insulating Film—

Onto a Si substrate, 0.001 mL of the obtained insulating film was applied by spin coating at 2,000 rpm for 30 seconds so as to attain the coating thickness of 200 nm. Thereafter, the Si substrate was placed on a hot plate the temperature of which was set at 200° C., and the drying was performed for 3 minutes to remove the solvent. Then, the coated film formed on the Si substrate was baked (annealing treatment) in an electric furnace of the nitrogen atmosphere having the oxygen concentration of 100 ppm or less at 400° C. for 30 minutes, to thereby obtain an insulating film.

Example 2

—Preparation of Insulating Film Material and Formation of Insulating Film—

An insulating film material was prepared in the same manner as in Example 1, provided that 10 g of polycarbosilane having the weight average molecular weight of approximately 400 was replaced with 10 g of polycarbosilane (NIPSI-L, manufactured by Nippon Carbon Co., Ltd.) having the weight average molecular weight of approximately 2,200.

Then, using the obtained insulating film material, an insulating film was formed in the same manner as in Example 1.

Example 3

—Formation of Insulating Film—

Onto a Si substrate, 0.001 mL of the insulating film material obtained in Example 2 was applied by spin coating at 2,000 rpm for 30 seconds so as to have the coating thickness of 200 nm. Thereafter, the Si substrate was placed on a hot place for drying at 60° C. for 3 minutes so as to remove the solvent, to thereby form an insulating film. Note that baking was not performed after the drying.

Example 4

—Preparation of Insulating Film Material and Formation of Insulating Film—

An insulating film material was prepared in the same manner as in Example 1, provided that 10 g of polycarbosilane having the weight average molecular weight of approximately 400 was replaced with 10 g of polycarbosilane (NIPSI-L, manufactured by Nippon Carbon Co., Ltd.) having the weight average molecular weight of approximately 29,000.

Then, using the obtained insulating film material, an insulating film was formed in the same manner as in Example 1.

Each of the insulating film materials obtained in Examples 1, 2 and 4 was measured in terms of the weight average molecular weight of polycarbosilane contained in the insulating film material and the amount of silanol contained therein by the following methods. The results are presented in Table 1-1.

<Measurement of Weight Average Molecular Weight (Mw)>

The weight average molecular weight (Mw) of polycarbosilane contained in the insulating film material was confirmed by gel permeation chromatography (GPC). As a result, Mw of polycarbosilane was approximately 400 in Example 1, approximately 2,200 in Example 2, and approximately 29,000 in Example 4, and no significant change in Mw was observed.

<Measurement of Silanol Amount>

Each insulating film material (0.001 mL) was made dissolve in 0.4 mL of deuterated chloroform, and the formation amount (content) of silanol in each insulating film material was calculated in accordance with a nuclear magnetic resonance method (NMR) based on % by weight by the following formula:

[Si—H]/Mw of polycarbosilane contained in the insulating film material×100

In addition, at the same time to above, it was also found that the main structure of the polycarbosilane compound contained in the insulating film material was the one expressed by the following structural formula 2:

Structural Formula 2

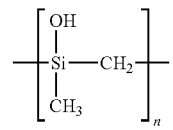

Note that, in the structural formula 2, the repeating number n was calculated from Mw measured by GPC.

Moreover, each of the insulating films obtained in Examples 1 to 4 were subjected to the measurements of the dielectric constant and film strength by the following methods. The results are presented in Table 1-1.

<Measurement of Dielectric Constant>

A metal electrode having a diameter of 1 mm was formed on an insulating film formed on a substrate of low resistance, and the capacity of the insulating film was measured using a prober connected to an AC power source of 1 MHz, 1V. The dielectric constant of the insulating film was calculated from the obtained capacity and a film thickness thereof measured by spectroscopic ellipsometry.

<Measurement of Film Strength>

The film strength of the insulating film was measured by means of a nanoindentation tester with the indentation of 20 nm.

Examples 5 to 8

—Preparation of Insulating Film Material and Formation of Insulating Film—

Insulating film materials of Examples 5 to 8 were prepared by mixing 5 g of the insulating film material (Mw of polycarbosilane=approximately 2,200) obtained in Example 2 and 5 g of each silane compound presented in Table 1-1.

Each of the obtained insulating film materials was subjected to the measurement of the amount of silanol contained in the insulating film in the manner described earlier. The results are presented in Table 1-1.

Moreover, using the obtained insulating film materials, insulating films were formed in the same manner as in Example 1.

Each of the obtained insulating films was subjected to the measurements of dielectric constant and film strength, in the same manners mentioned earlier.

The results are presented in Table 1-1.

Examples 9 to 15

—Preparation of Insulating Film Material and Formation of Insulating Film—

Insulating film materials of Examples 9 to 15 were prepared by mixing 5 g of the insulating film material (Mw of polycarbosilane=approximately 400) obtained in Example 1 and 5 g of each silane compound presented in Tables 1-1 and 1-2.

Each of the obtained insulating film materials was subjected to the measurement of the amount of silanol contained in the insulating film in the manner described earlier. The results are presented in Tables 1-1 and 1-2.

Moreover, using the obtained insulating film materials, insulating films were formed in the same manner as in Example 1.

Each of the obtained insulating films was subjected to the measurements of dielectric constant and film strength, in the same manners mentioned earlier. The results are presented in Tables 1-1 and 1-2.

Examples 16 to 18

—Preparation of Insulating Film Material and Formation of Insulating Film—

Insulating film materials of Examples 16 to 18 (the same insulating film material to that of Example 15) were prepared by mixing 5 g of the insulating film material (Mw of polycarbosilane=approximately 400) obtained in Example 1 and 5 g of each silane compound presented in Table 1-2.

Each of the obtained insulating film materials was subjected to the measurement of the amount of silanol contained in the insulating film in the manner described earlier. The results are presented in Table 1-2.

Moreover, using the obtained insulating film materials, insulating films were formed in the same manner as in Example 15, and light exposure depicted in Table 1-2 was performed on the obtained insulating films (Examples 16 to 18). A high pressure mercury lamp (wavelength of 200 nm to 600 nm) was used as a UV source, and emitted at a predetermined temperature (room temperature if it was not mentioned as 400° C.) for 10 minutes.

Each of the obtained insulating films was subjected to the measurements of dielectric constant and film strength, in the same manners mentioned earlier. The results are presented in Table 1-2.

Comparative Example 1

—Formation of Insulating Film—

A SiC:O:H film was formed as a conventional etching stopper film and CMP stopper film by vapor growth. Note that, as the insulating film was formed by vapor growth in Comparative Example 1, the formation rate of silanol could not be measured.

Comparative Example 2

—Formation of Insulating Film—

A conventional solution for forming an interlayer insulating film (CERAMATE NCS, manufactured by JGC Catalysts and Chemicals Ltd.) was used as a insulating film material. The solution for forming an interlayer insulating film was subjected to the measurement of the formation rate of silanol in the same manner as described earlier, and the formation rate thereof was 0.4% by weight.

Onto a Si substrate, the solution for forming an interlayer insulating film was applied by spin coating at 2,000 rpm for 30 seconds so as to attain the coating thickness of 200 nm. Thereafter, the Si substrate was placed on a hot plate the temperature of which was set at 200° C., and the drying was performed for 3 minutes to remove the solvent. Then, the coated film formed on the Si substrate was baked (annealing treatment) in an electric furnace of the nitrogen atmosphere having the oxygen concentration of 100 ppm or less at 400° C. for 30 minutes, to thereby obtain an insulating film.

Each of the obtained insulating films in Comparative Examples 1 to 2 was subjected to the measurements of dielectric constant and film strength, in the same manners mentioned earlier. The results are presented in Table 1-2.

Moreover, as an evidence for the acceleration of crosslinking, FT-IR spectrums of the insulating films obtained in Example 2 and Comparative Example 2 were depicted in FIG. 1.

As can be evident from FIG. 1, it was found that crosslinking was significantly accelerated in the insulating film of Example 2 compared to the insulating film of Comparative Example 2.

TABLE 1-1

|  | Mw of polycarbosilane | Repeating number n | Mixed silane compound | Amount of silanol group (mass %) | Dielectric constant | Film strength (GPa) |
|---|---|---|---|---|---|---|
| Ex. 1 | 400 | 5 | — | 20.3 | 2.69 | 8.9 |
| Ex. 2 | 2,200 | 30 | — | 18.7 | 2.57 | 10.3 |
| Ex. 3 | 2,200 | 30 | — | 18.7 | 2.80 | 7.3 (no annealing) |
| Ex. 4 | 29,000 | 400 | — | 16.9 | 2.71 | 16.7 |
| Ex. 5 | 2,200 | 30 | Tetraethoxysilane | 12.3 | 2.33 | 16.8 |
| Ex. 6 | 2,200 | 30 | 1,1,3,3-tetramethyldisilane | 9.5 | 2.16 | 11.8 |
| Ex. 7 | 2,200 | 30 | Triethylsilanol | 6.7 | 2.18 | 10.2 |
| Ex. 8 | 2,200 | 30 | Trimethylchlorosilane | 6.2 | 2.11 | 9.9 |
| Ex. 9 | 400 | 5 | Vinyltriethoxysilane | 9.7 | 2.29 | 15.9 |
| Ex. 10 | 400 | 5 | Vinylmethyldiethoxysilane | 10.5 | 2.22 | 14.1 |

TABLE 1-2

| | Mw of polycarbosilane | Repeating number n | Mixed silane compound | Amount of silanol group (mass %) | Dielectric constant | Film strength (GPa) |
|---|---|---|---|---|---|---|
| Ex. 11 | 400 | 5 | Vinylphenyl diethoxysilane | 12.1 | 2.23 | 13.5 |
| Ex. 12 | 400 | 5 | Bis (dimethylamino)diphenylsilane | 11.4 | 2.25 | 13.0 |
| Ex. 13 | 400 | 5 | 4-[2-(trichlorosilyl)ethyl]pyridine | 10.6 | 2.30 | 15.2 |
| Ex. 14 | 400 | 5 | 1,1,3,3-tetraphenyl dimethyldisilazane | 10.8 | 2.20 | 12.9 |
| Ex. 15 | 400 | 5 | Trivinyl ethoxysilane | 11.1 | 2.04 | 11.5 |
| Ex. 16 | 400 | 5 | Trivinyl ethoxysilane | 11.1 | 2.11 UV treatment | 14.7 |
| Ex. 17 | 400 | 5 | Trivinyl ethoxysilane | 11.1 | 2.15 UV (vacuumed) treatment | 15.2 |
| Ex. 18 | 400 | 5 | Trivinyl ethoxysilane | 11.1 | 2.17 UV (400° C.) treatment | 16.1 |
| Comp. Ex. 1 | | | Conventional etching stopper film, CMP stopper film (SiC:O:H) | — | 3.28 | 14.3 |
| Comp. Ex. 2 | | | Conventional interlayer insulating film (porous silica film) | 0.4 | 2.32 | 9.8 |

From the results presented Tables 1-1 and 1-2, it was found that the insulating films formed by using the insulating film materials each containing a silanol group of Examples 1 to 18 had low dielectric constant, and desirable film strength. Especially, the insulating films of Examples 1 to 4 had lower dielectric constant than those of the conventional etching stopper film and CMP stopper film, and the insulating films of Examples 5 to 18, which were respectively formed by using the insulating film materials containing a mixture of the polycarbosilane compound and the silane compound, had the film strength superior to that of the conventional interlayer insulating film. Moreover, the insulating films of Examples 9 to 18, which were respectively formed by using the insulating film material containing the silane compound having an unsaturated bonding-contained group, could realize both low dielectric constant and high film strength at a desirable balance. Furthermore, the insulating films of Examples 16 to 18, which were respectively formed by using the insulating film material containing the silane compound having an unsaturated bonding-contained group and subjected to light exposure, had desirable film strength. Comparing Examples 1, 2 and 4 in which annealing was performed to Example 3 in which annealing was not performed, it was found that the film strength was improved by annealing.

On the other hand, the insulating film of Comparative Example 1, which was formed by using the insulating film material containing no silanol group, had desirable film strength, but high dielectric constant.

Examples 19 to 22

—Production of Semiconductor Device—

An interlayer insulating film was formed by using the insulating film material of the present embodiment, and the semiconductor device of the present embodiment having a multilayer wiring structure containing the interlayer insulating film was produced in the following manner.

Figure 2A:
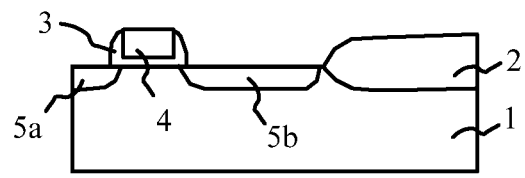
FIG. 2A is a process diagram (part 1) illustrating an example of a method for producing a semiconductor having a multilayer wiring structure including an interlayer insulating film formed by using the insulating film material.
Figure 2B:
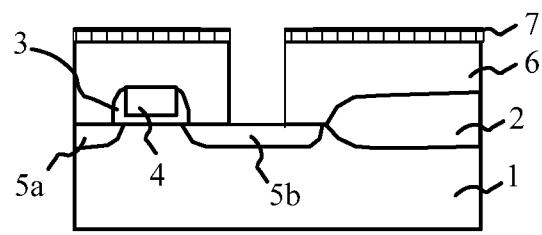
FIG. 2B is a process diagram (part 2) illustrating an example of a method for producing a semiconductor having a multilayer wiring structure including an interlayer insulating film formed by using the insulating film material.
Figure 2C:
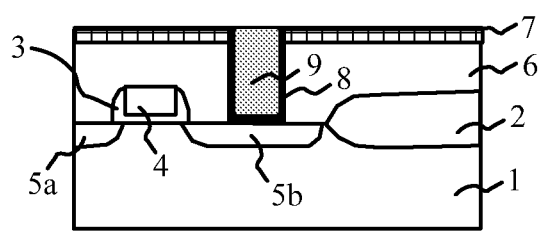
FIG. 2C is a process diagram (part 3) illustrating an example of a method for producing a semiconductor having a multilayer wiring structure including an interlayer insulating film formed by using the insulating film material.

At first, on a Si wafer 1 to which a source diffusion layer 5a and a drain diffusion layer 5b that were separated with an element isolation film 2, and a transistor layer forming a gate electrode 4 having a side wall insulating film 3 were formed as illustrated in FIG. 2A, an interlayer insulating film 6 (glass) and a stopper film 7 were formed and then a contact hole for output of the electrode was formed as illustrated in FIG. 2B. Then, a barrier film 8 (TiO) was formed on the contact hole by sputtering so as to have a thickness of 50 nm, followed by filling the contact hole with a conductor plug 9 (blanket) formed of W by mixing $WF_6$ and hydrogen and reducing, to thereby form a via, at the same time, removing the portions other than via by chemical mechanical polishing (CMP), as illustrated in FIG. 2C.

Figure 2D:
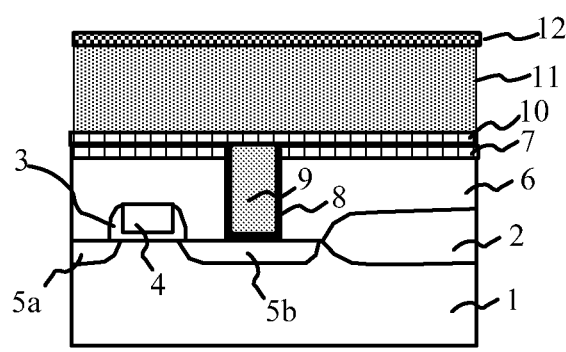
FIG. 2D is a process diagram (part 4) illustrating an example of a method for producing a semiconductor having a multilayer wiring structure including an interlayer insulating film formed by using the insulating film material.
Figure 2E:
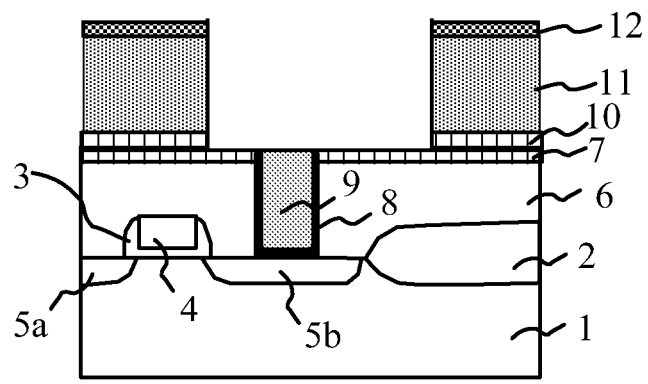
FIG. 2E is a process diagram (part 5) illustrating an example of a method for producing a semiconductor having a multilayer wiring structure including an interlayer insulating film formed by using the insulating film material.
Figure 2F:
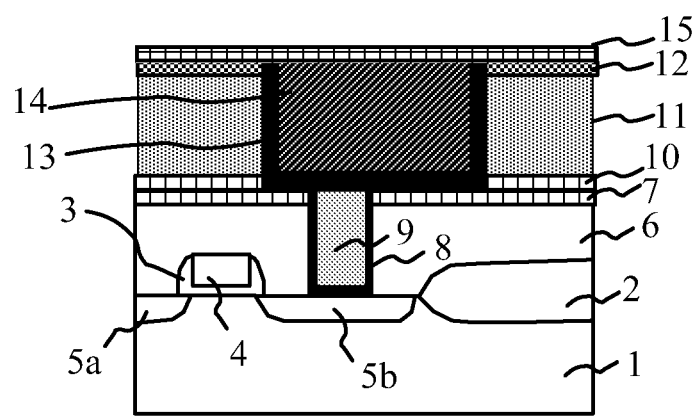
FIG. 2F is a process diagram (part 6) illustrating an example of a method for producing a semiconductor having a multilayer wiring structure including an interlayer insulating film formed by using the insulating film material.

Following to the above, an insulating film 10 of any of Examples 1 to 4 (hereinafter, may also be referred as to "the film of the present embodiment") was formed on the stopper film 7 in which the via was formed so as to have a thickness of 30 nm, a porous silica (CERAMATE NCS, manufactured by JGC Catalysts and Chemicals Ltd.) film 11 was laminated on the insulating film so as to have a thickness of 160 nm, and the film of the present embodiment 12 was formed on the porous silica film so as to have a thickness of 30 nm, as illustrated in FIG. 2D. Then, as illustrated in FIG. 2E, wiring gutters were formed on the film of the present embodiment 12 by a F plasma method using $CF_4/CHF_3$ gas as a source, using a resist layer to which a pattern for the first layer having a wiring width of 100 nm and a space of 100 nm was formed. Here, the film of the present embodiment 10 functioned as an etching stopper film. Thereafter, as illustrated in FIG. 2F, a barrier film 13 (TaN), which inhibits diffusion of the wiring material (copper) to the porous silica film 11, was formed by sputtering on the obtained wiring gutters so as to have a thickness of 10 nm. Next, on the surface of the barrier film 13 formed on the wiring gutters, a seed layer (Cu), which functioned as an electrode at the time of electroplating, was formed by sputtering so as to have a thickness of 10 nm. Next, after laminating a copper wiring 14 (Cu) by electroplating at a thickness of approximately 600 nm, the cupper deposited other than the wiring pattern portion was removed by chemical mechanical polishing (CMP), and a SiN film as a stopper film (diffusion inhibiting film) 15 was formed by vapor growth so as to have a thickness of 30 nm, to thereby form the first wiring layer (copper).

Figure 2G:
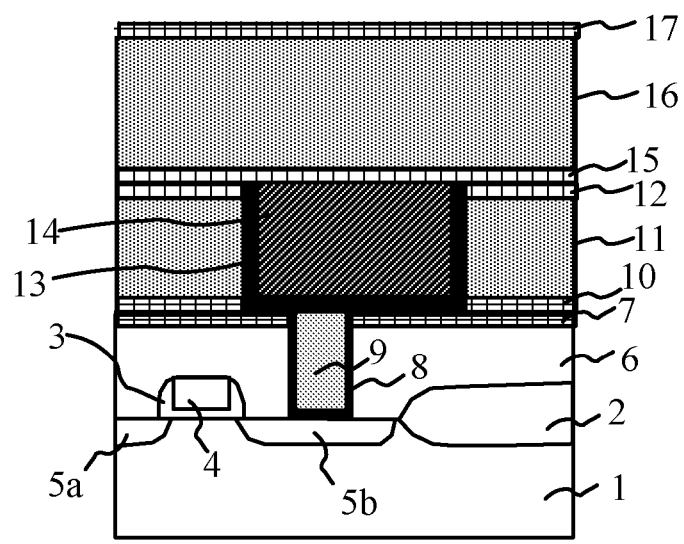
FIG. 2G is a process diagram (part 7) illustrating an example of a method for producing a semiconductor having a multilayer wiring structure including an interlayer insulating film formed by using the insulating film material.
Figure 2H:
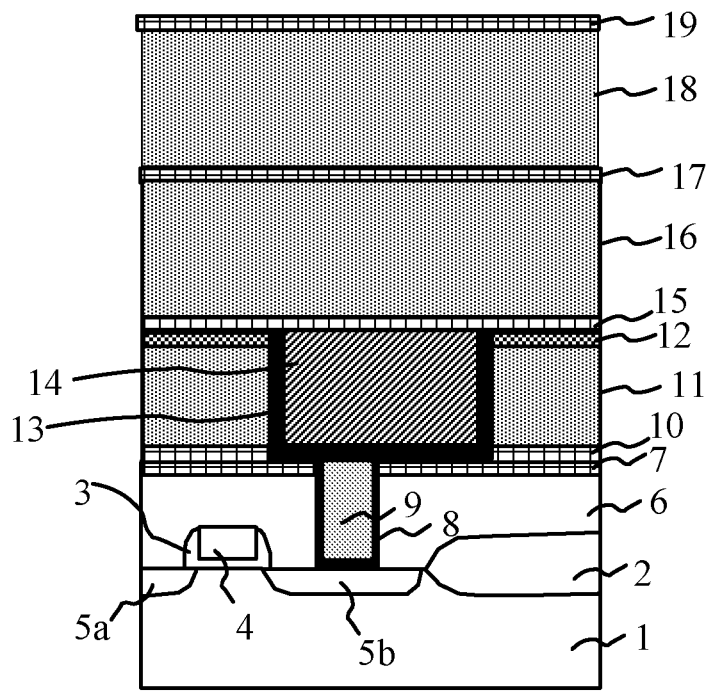
FIG. 2H is a process diagram (part 8) illustrating an example of a method for producing a semiconductor having a multilayer wiring structure including an interlayer insulating film formed by using the insulating film material.

Thereafter, as illustrated in FIG. 2G, a porous silica film 16 was laminated on the stopper film (diffusion inhibiting film) 15 so as to have a thickness of 180 nm. On the porous silica film 16, a film of the present embodiment 17 was formed so as to have a thickness of 30 nm. Furthermore, as illustrated in FIG. 2H, a porous silica film 18 was formed on the film of the present embodiment 17 to have a thickness of 160 nm, followed by laminating a film of the present embodiment 19 so as to have a thickness of 30 nm.

Figure 2I:
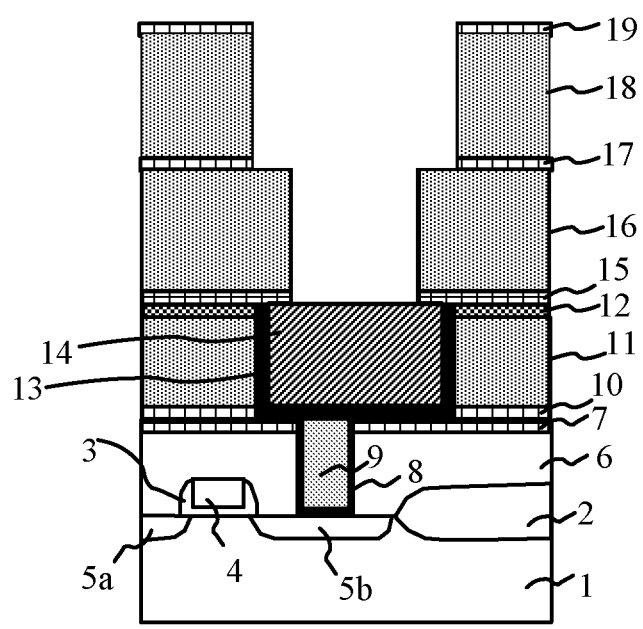
FIG. 2I is a process diagram (part 9) illustrating an example of a method for producing a semiconductor having a multilayer wiring structure including an interlayer insulating film formed by using the insulating film material.

As illustrated in FIG. 2I, using the resist layer to which a via pattern was formed as a mask, a via was formed to these insulating films by applying a gas composition and pressure in accordance with a F plasma method using $CF_4/CHF_3$ gas as a source, and processing the film of the present embodiment 19, the porous silica film 18, the film of the present embodiment 17, and the porous silica film 16 in this order. Next, using a resist layer to which the second wiring pattern was formed as a mask, wiring gutters were formed by a F plasma method using $CF_4/CHF_3$ gas as a source.

Figure 2J:
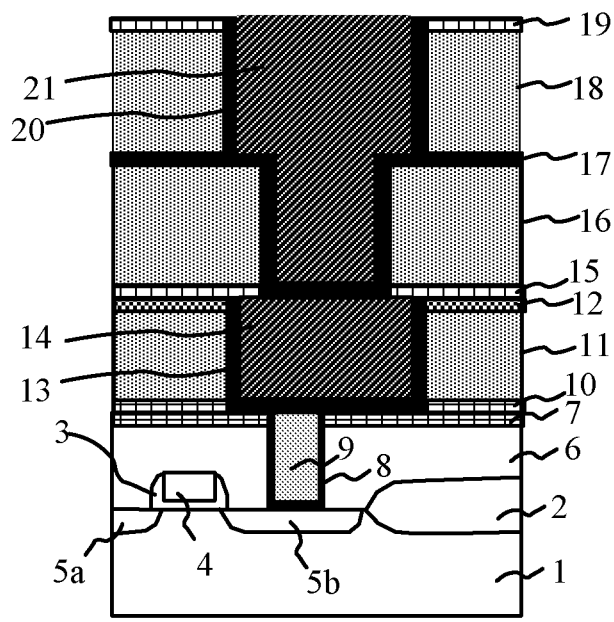
FIG. 2J is a process diagram (part 10) illustrating an example of a method for producing a semiconductor having a multilayer wiring structure including an interlayer insulating film formed by using the insulating film material.
Figure 2K:
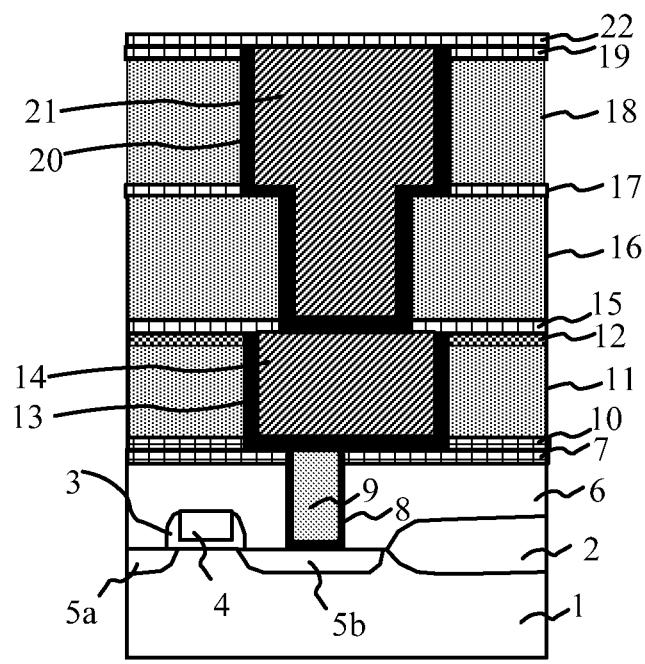
FIG. 2K is a process diagram (part 11) illustrating an example of a method for producing a semiconductor having a multilayer wiring structure including an interlayer insulating film formed by using the insulating film material.

As illustrated in FIG. 2J, a barrier film 20 (TaN), which inhibited the diffusion of the wiring material (copper) to the porous silica film 18, was formed on the obtained via and wiring gutters by sputtering, so as to have a thickness of 10 nm. Next, on the surface of the barrier film 20 formed on the wiring gutters, a seed layer (Cu), which functioned as an electrode at the time of electroplating, was formed so as to have a thickness of 10 nm. Thereafter, a copper wiring 21 (Cu) was laminated by electroplating so as to have a thickness of 1,400 nm, followed by removing the copper deposited other than the wiring pattern portion by chemical mechanical polishing (CMP). Here, the film of the present embodiment 19 functioned as a stopper film. As illustrated in FIG. 2K, a SiN film 22 was formed by vapor growth so as to have a thickness of 30 nm, to thereby form the second via and wiring layer (copper).

Hereinafter, the formations of the second via and wiring layer (copper) was repeated to thereby produce a semiconductor device having a copper wiring of a three-layered structure (the copper wiring of the three-layered structure was corresponded to the aforementioned multilayer wiring structure), which contains the third via and wiring layer (copper). In the manner described above, 1,000,000 pieces of prototype semiconductor devices each having a sequential via wherein the via and the copper wiring were sequentially formed were produced, and the yield of the sequential via and the effective dielectric constant were calculated based on the interlayer capacitance. The results are presented in Table 2.

Examples 23 to 26

Semiconductor devices were produced in the same manner as in Examples 19 to 22, provided that, the films of the present embodiments 10, 12, 17 were 19 respectively replaced with a SiC:O:H film formed by vapor growth, and the porous silica films 11, 16, and 18 were respectively replaced with an insulating film (a film of the present embodiment) formed in any of Examples 5 to 8. In these semiconductor devices, the films of the present embodiment 11, 16, and 18 respectively functioned as an interlayer insulating film.

Comparative Example 3

—Production of Semiconductor Device—

A semiconductor device was produced in the same manner as in Example 19, provided that the films of the present embodiment 10 and 17 were respectively replaced with the conventional etching stopper film formed in Comparative Example 1, and the films of the present embodiment 12 and 19 were respectively replaced with the conventional CMP stopper film formed in Comparative Example 1.

Note that, the porous silica films 11, 16, and 18 of Example 19 were respectively corresponded to the conventional interlayer insulating film formed in Comparative Example 2.

In the manner described above, 1,000,000 pieces of prototype semiconductor devices each having a sequential via wherein the via and the copper wiring were sequentially formed were produced, and the yield of the sequential via and the effective dielectric constant were calculated based on the interlayer capacitance. The results are presented in Table 2.

TABLE 2

| Multilayer wiring semiconductor device | Insulating film | | Effective dielectric constant | Yield (%) |
|---|---|---|---|---|
| Example 19 | Example 1 | Etching stopper film | 2.39 | 86.8 |
| Example 20 | Example 2 | and CMP stopper film | 2.36 | 94.7 |
| Example 21 | Example 3 | | 2.41 | 81.5 |
| Example 22 | Example 4 | | 2.39 | 83.2 |
| Example 23 | Example 5 | Interlayer insulating | 2.43 | 94.7 |
| Example 24 | Example 6 | film | 2.35 | 91.1 |
| Example 25 | Example 7 | | 2.38 | 89.3 |
| Example 26 | Example 8 | | 2.29 | 81.2 |
| Comparative Example 3 | Comparative Example 1 | Etching stopper film and CMP stopper film | 2.52 | 76.9 |
| | Comparative Example 2 | Interlayer insulating film | | |

From the results presented in Table 2, the semiconductors each having a multilayer wiring structure including insulating films (an interlayer insulating film, an etching stopper film, and a CMP stopper film) formed by using the insulating film material of the present embodiment had low effective dielectric constant between the wirings, achieved lowing of the parasitic capacitance between the wirings and lowing of wiring resistance, and had desirable production yield compared to the case using the insulating films of Comparative Examples.

Example 27

—Production of Multilayer Wiring Board—

Example 27 is an example of a multilayer wiring board of the present embodiment using the insulating film material of the present embodiment.

Figure 3:
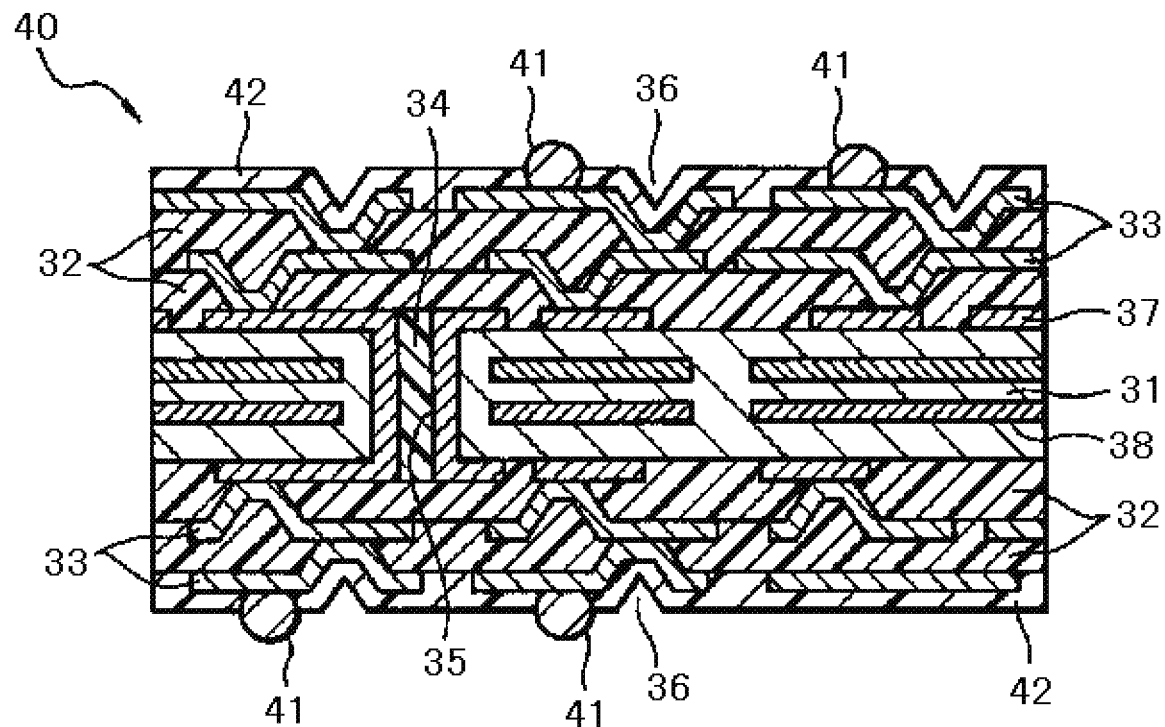
FIG. 3 is a schematic cross-sectional diagram illustrating an example of the multilayer wiring board.

FIG. 3 is a schematic cross-sectional diagram explaining an example related to a production of a build-up print board, which is an example of the multilayer wiring board of the present embodiment.

At first, interlayer insulating films 32 were formed on each side of a core substrate 31 (which was generally formed of a resin containing filler for reinforcement such as glass fibers, and contained copper wiring layers 37 formed of fine patterns on the both sides, a through hole 35 filled with insulating resin 34 to connect the wiring layers 37 of the both sides, and wiring layers 38 formed inside of the substrate itself) using the insulating film material of the present embodiment, and a photosensitive resin material was applied onto the surface of the interlayer insulating film 32, followed by light exposure and development, to thereby form via holes 36. Thereafter, a copper was deposited on the obtained interlayer insulating film 32 by electroless plating followed by electroplating, and the deposited copper was patterned to thereby form a copper wiring layer 33. Then, the procedure of from the aforementioned formation of the interlayer insulating film 32 to the aforementioned formation of the wiring layer 33 was repeated to thereby produce a multilayer circuit board 40. Note that, the multilayer circuit board 40 was further equipped with solder bumps 41 formed to be adjacent to the wiring layer 33 disposed at the uppermost position for the purpose of connecting with an external circuit, and a solder resist layer 42 also served as a protective layer.

Example 28

—Semiconductor Device and Production Thereof—

Example 28 is an example of the semiconductor device of the present embodiment using the insulating film material of the present embodiment, and a production method thereof.

Figure 4A:
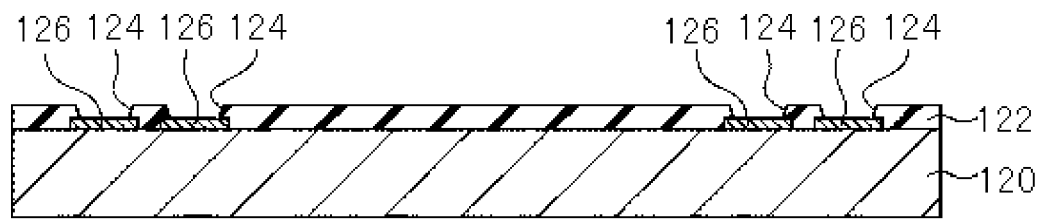
FIG. 4A is a process diagram (part 1) for producing an example of the semiconductor device.

At first, as illustrated in FIG. 4A, a logic circuit (not illustrated), a memory circuit (not illustrated), and the like were formed on a surface of a semiconductor substrate 120 such as a silicon wafer, using a functional element such as a MOS transistor, a passive element such as a capacitor element, and the like. Then, an interlayer insulating film 122 was formed on the semiconductor substrate 120 using the insulating film material of the present embodiment. Although a plurality of the interlayer insulating films 122 and wiring layers were alternately formed on the semiconductor substrate 120, only one layer was illustrated in FIG. 4A. The opening portions 124 were formed in the interlayer insulating film 122, and an electrode pad 126 formed of, for example aluminum (Al), electrically connected to the logic circuit, the memory circuit, and the like was disposed in each opening portion 124.

Note that, in the present example, the following procedure was carried out in the condition that the semiconductor substrate 120 was not cut into each a semiconductor element (a semiconductor chip) for reducing the production cost, but the following procedure may be carried out after cutting the semiconductor substrate 120 and separating each semiconductor element.

Figure 4B:
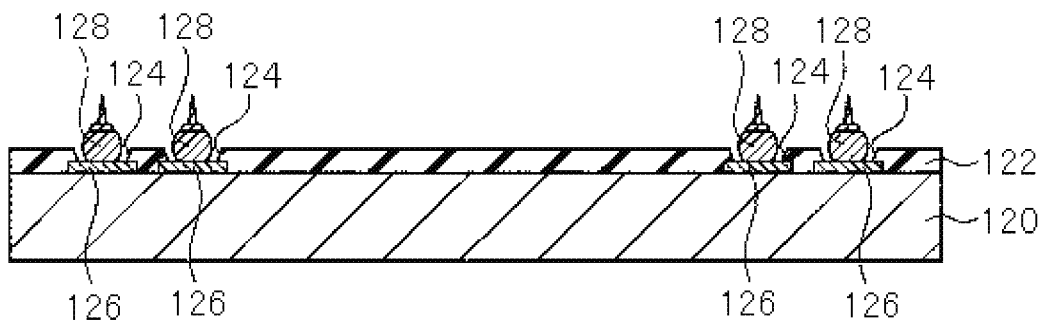
FIG. 4B is a process diagram (part 2) for producing an example of the semiconductor device.

Next, as illustrated in FIG. 4B, stud bumps 128 formed of, for example gold (Au) or copper (Cu) were respectively formed on the electrode pad 126. Note that, the stud bump 128 is a bump electrode formed on the electrode pad 126 by using a ball bonding system used for a wire bonding technology. After forming a ball at the edge of the wire formed of gold (Au) or the like by discharging, the ball was thermally pressure-bonded onto the electrode pad 126 formed of aluminum or the like by using a capillary for a wire bonding, the capillary was pulled out in the state where the wire was fixed, resulted in cutting the wire at the upper edge portion of the ball, to thereby form the stud bump 128.

Note that, before forming the stud bump 128, each semiconductor chip formed on the semiconductor substrate 120 was subjected to the inspection or a test, and the stud bump 128 may be formed on only the electrode pad 126 of the semiconductor chip passed the inspection or the test. In this case, the stud bump 128 is not formed on the electrode pad 126 of the semiconductor chip, which is not desirable, and thus the production cost can be reduced.

Figure 4C:
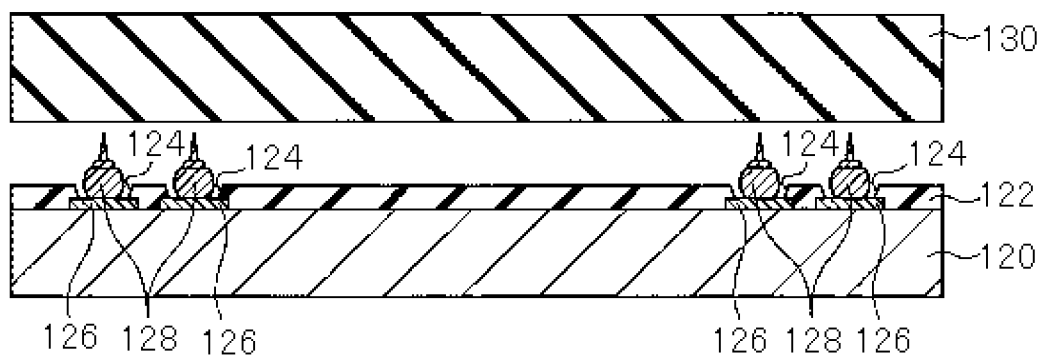
FIG. 4C is a process diagram (part 3) for producing an example of the semiconductor device.

Next, as illustrated in FIG. 4C, a resin film 130 (thickness of 60 µm) was placed on the semiconductor substrate 120. As the resin film 130, for example, a film for forming an insulating layer ABF manufactured by Ajinomoto Co., Inc.

Figure 4D:
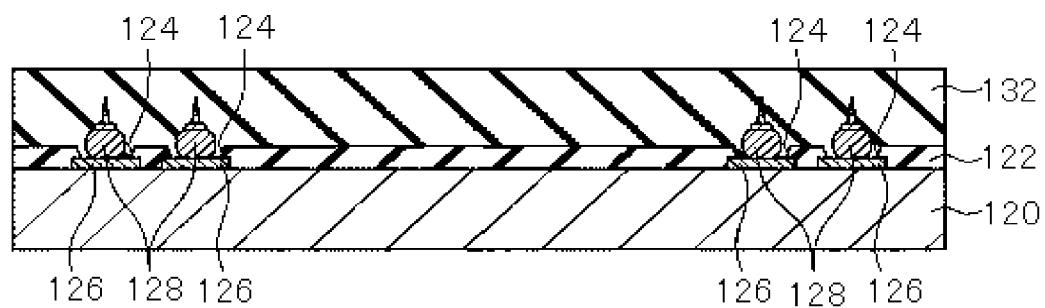
FIG. 4D is a process diagram (part 4) for producing an example of the semiconductor device.

Thereafter, as illustrated in FIG. 4D, the resin film 130 was bonded to the semiconductor substrate 120, on which the interlayer insulating film 122 and the like had been formed, by means of a vacuum press. Specifically, the resin film 130 was bonded onto the interlayer insulating film 122 by heating at 150° C. to melt and reducing the pressure, to thereby form a resin layer 132. Here, the stud bumps 128 were left to be embedded in the resin layer 132.

Thereafter, the resin layer 132 was cured, for example, by heating at 170° C. for one hour.

Figure 5A:
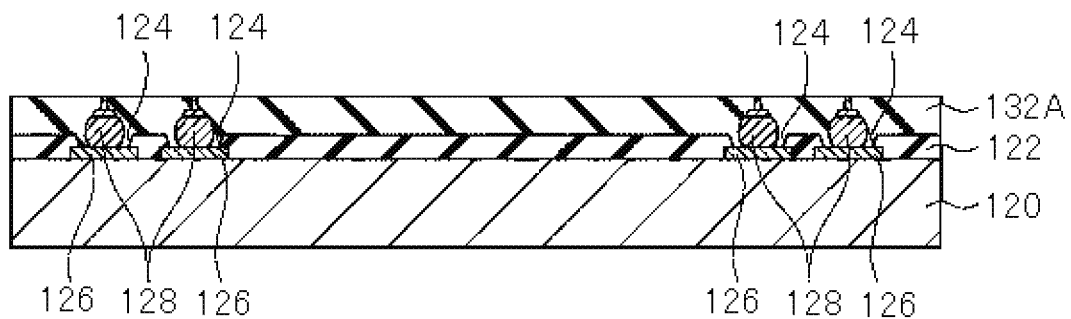
FIG. 5A is a process diagram (part 5) for producing an example of the semiconductor device.

Next, the surface portion of the resin layer 132 and the upper portion of the stud bumps 128 were polished by chemical mechanical polishing (CMP). As a result, the upper edge surfaces of the stud bumps 128 were respectively exposed to the polished surface of the resin layer 132A (hereinafter, the resin layer after polishing was referred to as the resin layer 132A, and distinguished from the resin layer 132 before polishing), as illustrated in FIG. 5A.

Figure 5B:
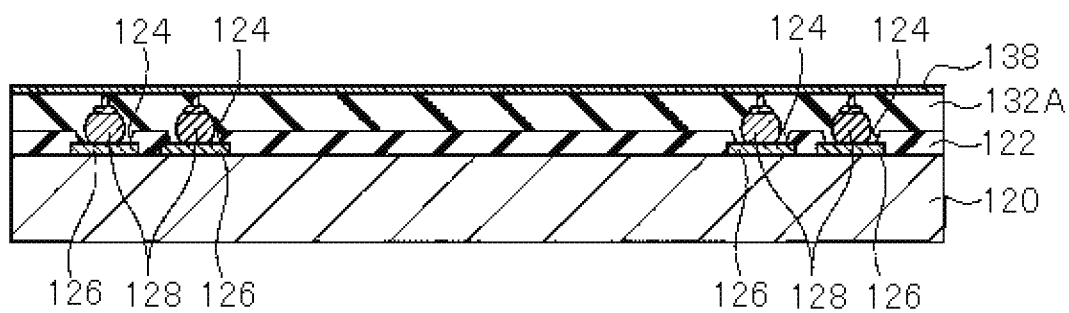
FIG. 5B is a process diagram (part 6) for producing an example of the semiconductor device.

Thereafter, as illustrated in FIG. 5B, a seed layer 138 formed of copper or nickel was formed on the entire surface by electroless plating. The seed layer 138 was formed, for example, by after performing conditioning, deposition of a catalyst onto the surface of the resin layer 132A, and the like, performing electroless plating. In such a manner, the seed layer 138 formed of the electroless plating film having a thickness of, for example, 0.3 µm to 0.5 µm. This seed layer 138 was formed so as to physically contact with the exposed edge surfaces of the stud bumps 128, and made electrically conductive.

Figure 6A:
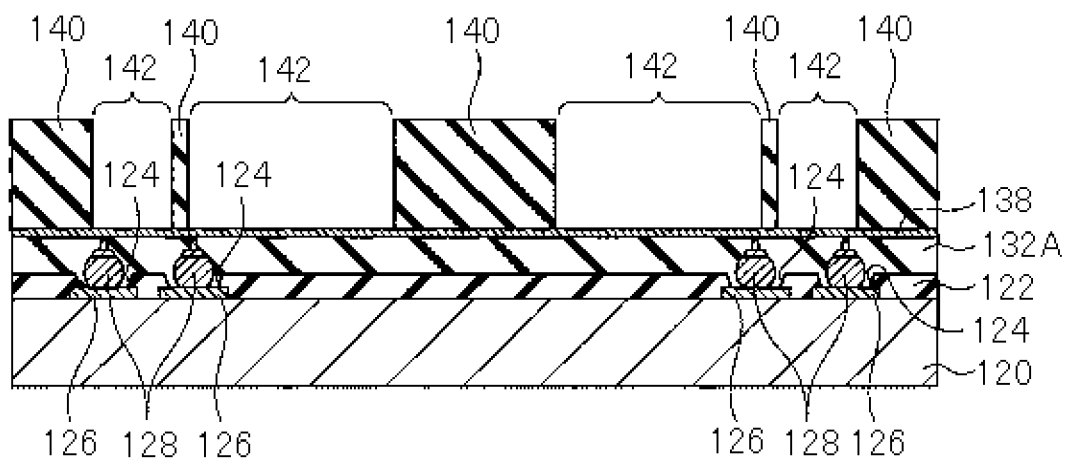
FIG. 6A is a process diagram (part 7) for producing an example of the semiconductor device.

Thereafter, as illustrated in FIG. 6A, a photoresist film 140 was formed on the entire surface by spin coating.

Then, opening portions 142 each reaching the seed layer 138 were formed in the photoresist film 140 by using a technique of photolithography. The opening portion 142 is for forming a wiring 144 (see FIG. 6C).

Figure 6B:
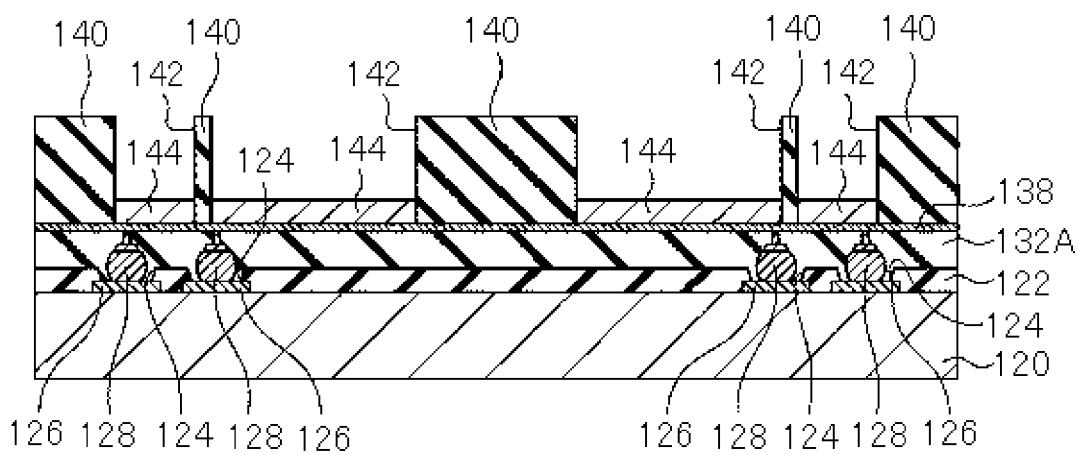
FIG. 6B is a process diagram (part 8) for producing an example of the semiconductor device.

Next, as illustrated in FIG. 6B, wirings 144 each formed of Cu were formed on the seed layer 138 within the opening portions 142 of the photoresist film 140.

Figure 6C:
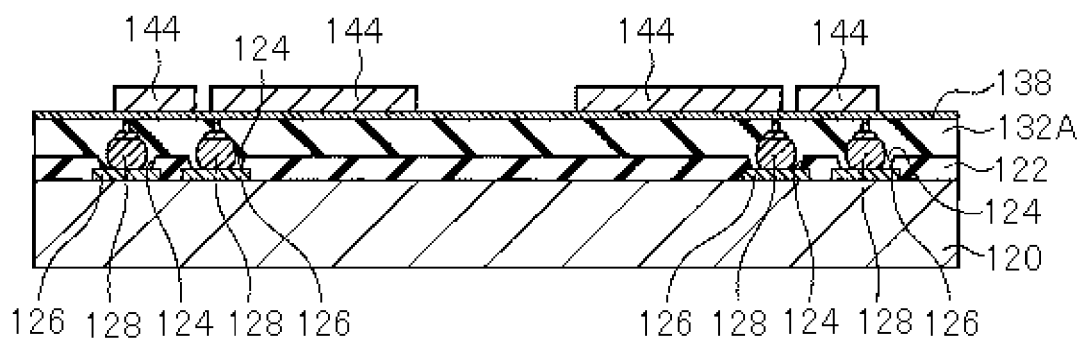
FIG. 6C is a process diagram (part 9) for producing an example of the semiconductor device.

Thereafter, as illustrated in FIG. 6C, the photoresist film 140 was removed.

Figure 7A:
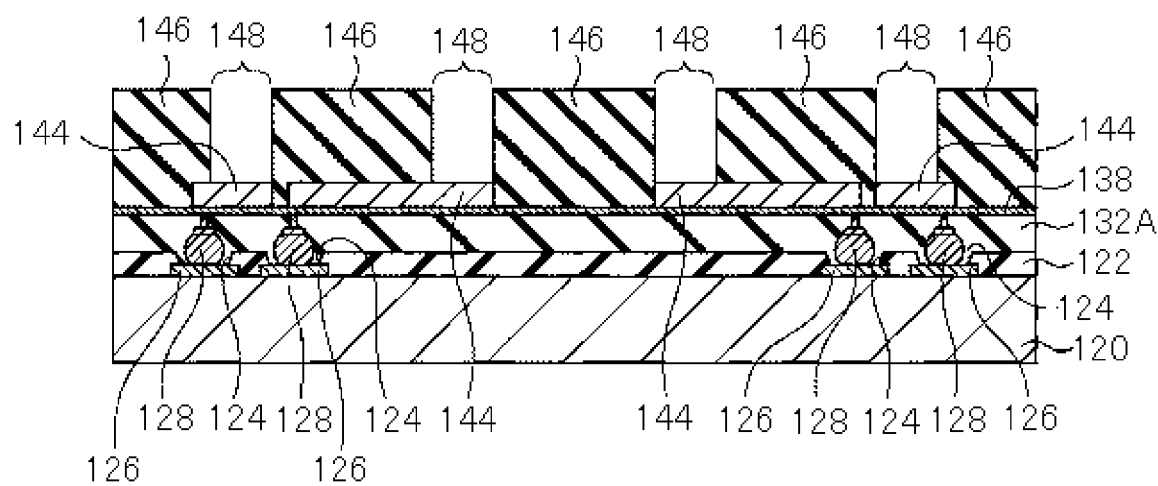
FIG. 7A is a process diagram (part 10) for producing an example of the semiconductor device.

Next, as illustrated in FIG. 7A, a photoresist film 146 was formed on the entire surface of the wirings 144 and the seed layer 138 by spin coating.

Thereafter, opening portions 148 each reaching the wiring 144 were formed by using a technique of photolithography. The opening portion 148 is for forming a conductive plug 150 (see FIG. 7B).

Figure 7B:
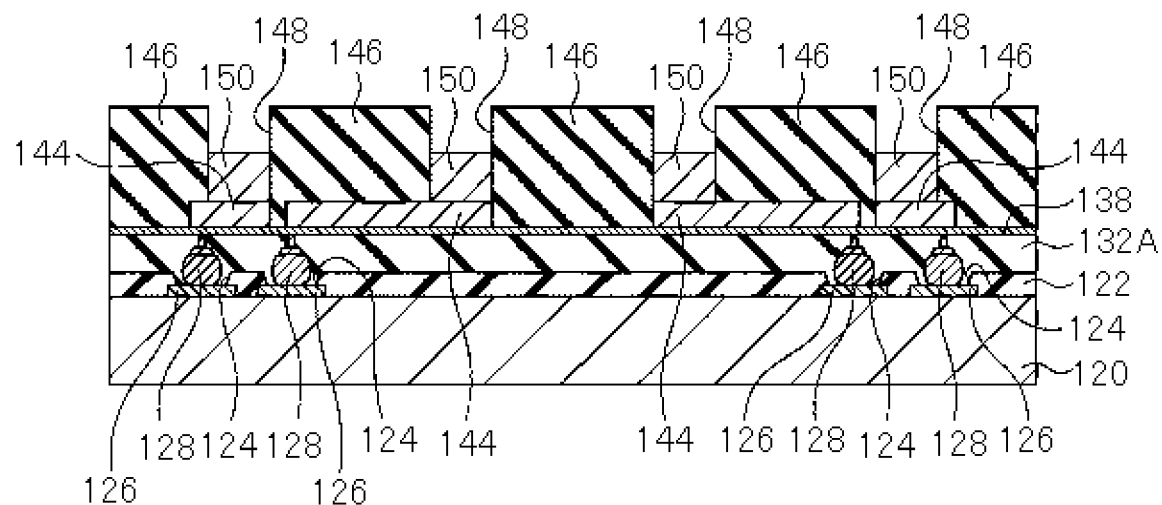
FIG. 7B is a process diagram (part 11) for producing an example of the semiconductor device.

Next, as illustrated in FIG. 7B, a conductive plugs 150 each formed of Cu were respectively formed in the opening option 148 by electroplating.

Figure 7C:
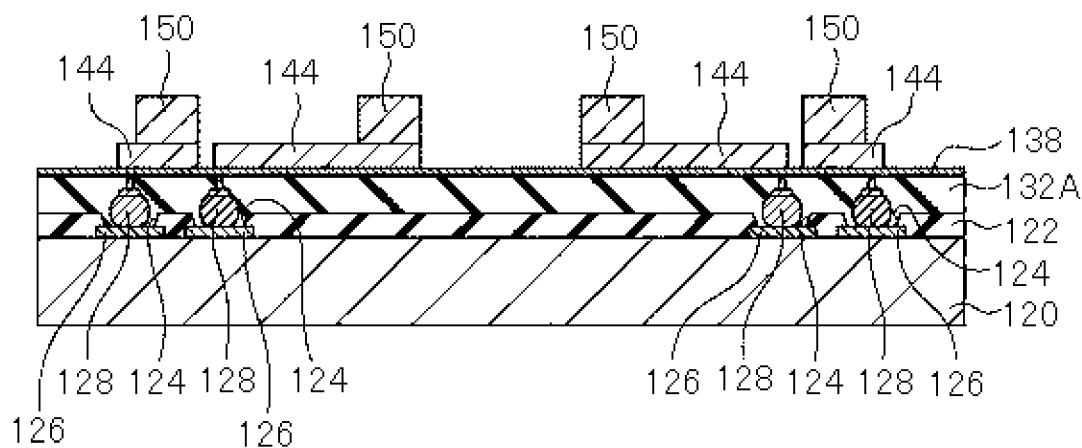
FIG. 7C is a process diagram (part 12) for producing an example of the semiconductor device.

Thereafter, as illustrated in FIG. 7C, the photoresist film 146 was removed.

Figure 8A:
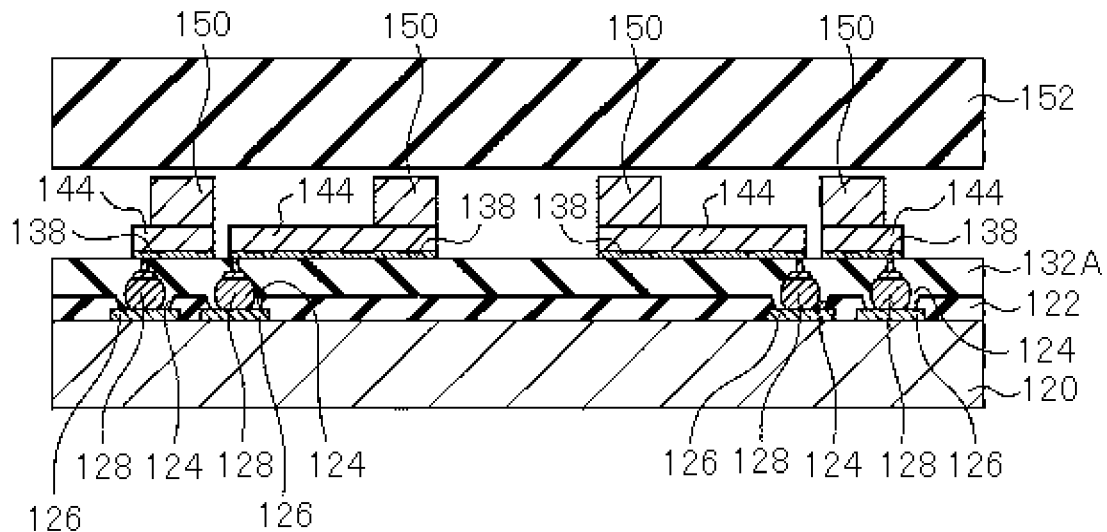
FIG. 8A is a process diagram (part 13) for producing an example of the semiconductor device.

Next, as illustrated in FIG. 8A, the portions of the seed layer 138 where was surrounding the wirings 144 and being exposed were removed by wet etching. As the etching solution, for example, an approximately 1% to approximately 10% ammonium persulfate aqueous solution might be used. The duration for etching was, for example, approximately 2 minutes. At the time when the seed layer 138 was etched and removed, the wirings 144 or the surfaces of the conductive plugs 150 were also slightly etched. However, the thickness of the seed layer 138 was sufficiently small compared to the size of the wiring 144 or the conductive plug 150, and thus the seed layer 138 could be etched within a short period of time. Therefore, when the seed layer 138 was etched, the wirings 144 or the conductive plugs 150 were not excessively etched.

Next, a resin film 152 was placed on the semiconductor substrate 120. Similarly to the resin film 130, a film for forming an insulating layer ABF manufactured by Ajinomoto Co., Inc. can be used as the resin film 152.

Figure 8B:
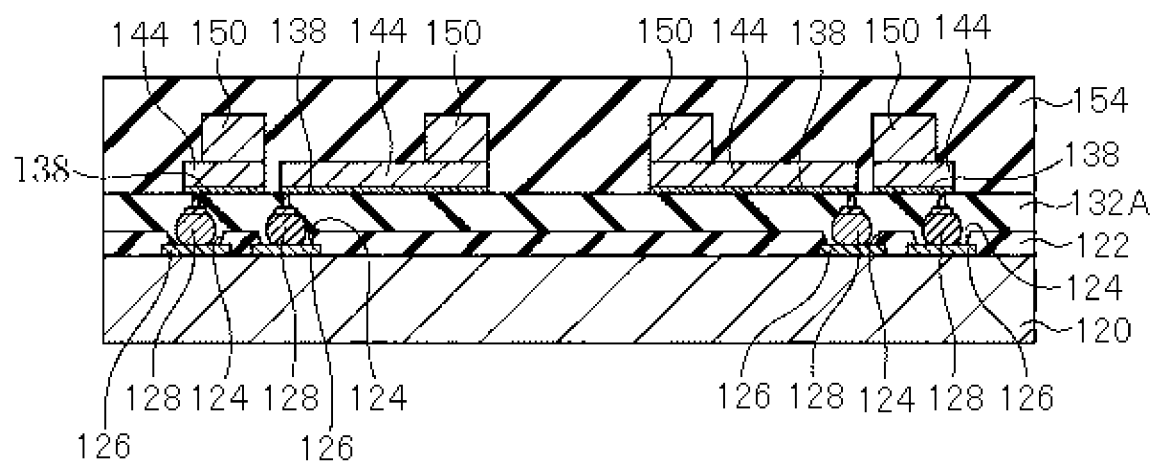
FIG. 8B is a process diagram (part 14) for producing an example of the semiconductor device.

Next, as illustrated in FIG. 8B, the resin film 152 was bonded to the resin layer 132A to which the wirings 144 and the conductive plugs 150 had been formed by a vacuum press. Specifically, the resin film 152 was bonded to the resin layer 132A by heating at 150° C. the resin film 152 to melt and reducing the pressure. In this manner a resin layer 154 formed of the resin film 152 was formed on the resin layer 132A.

Here, the wirings 144 and the conductive plugs 150 were left to be embedded in the resin layer 154.

Next, the resin layer 154 was cured by heating at 170° C. for one hour.

Figure 9A:
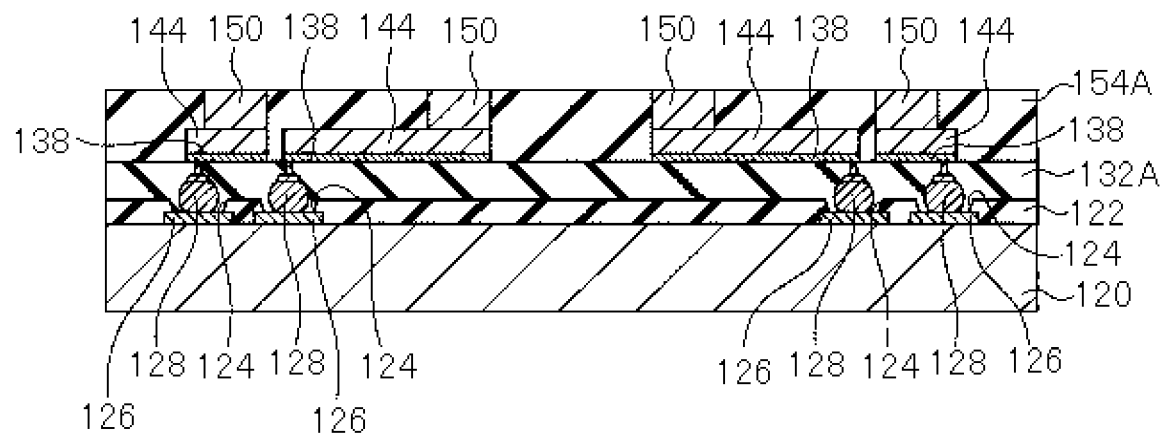
FIG. 9A is a process diagram (part 15) for producing an example of the semiconductor device.

Next, as illustrated in FIG. 9A, the surface portion of the resin layer 154 and the upper portions of the conductive plugs 150 were polished by chemical mechanical polishing (CMP). Hereinafter, the resin layer after polishing is referred as to the resin layer 154A, and is distinguished from the resin layer 154 before polishing.

Figure 9B:
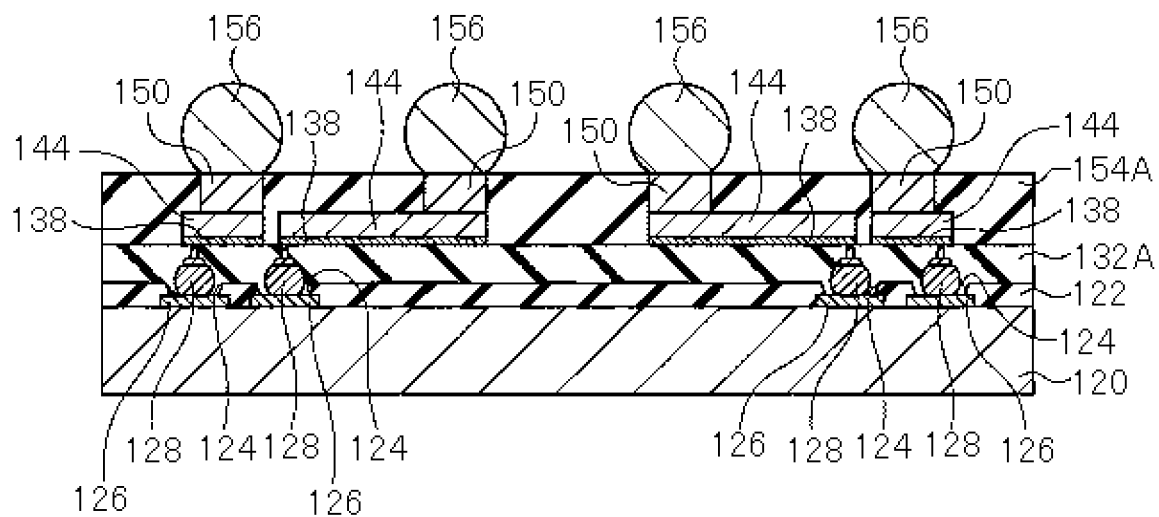
FIG. 9B is a process diagram (part 16) for producing an example of the semiconductor device.

Next, as illustrated in FIG. 9B, solder bumps 156 each formed of, for example, Sn solder, were respectively formed on the conductive plug 150.

Note that, the case where the solder bump 156 was directly formed on the conductive plug 150 was explained as an example, but a barrier metal film (not illustrated) formed of nickel (Ni) or gold (Au) could be formed on the conductive plug 150. When the barrier metal film was formed on the conductive plug 150 and then the solder bump was formed on the barrier metal film, the diffusion of the material of the conductive plug 150 into the solder bump 156 can be prevented.

Next, the semiconductor substrate was cut by using a thin blade formed by solidifying diamond particles or the like with a binder and each semiconductor element (semiconductor chip) was separated. Note that, in the case where the semiconductor substrate had been cut in advance so that each semiconductor element was separated, such process was not necessary.

In the manner described above, the semiconductor device of the present embodiment was produced.

Due to the structure mentioned above, the electrode pads 126 of the semiconductor substrate 120 are each electrically connected to external parts via the stud bump 128, the wiring 144 including the seed layer 138, the conductive plug 150, and the solder bump 156.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

The insulating film material of the invention has low dielectric constant, and is preferably used for the formation of an insulating film having high film strength, such as an interlayer insulating film, an etching stopper film, and a chemical mechanical polishing stopper film (a CMP stopper film), especially preferable for a multilayer wiring board and a semiconductor device.

The multilayer wiring board of the invention is capable of speeding up a signal transmission, and is particularly preferable for a semiconductor integrated circuit or the like which appreciates high speed response.

Since the semiconductor device of the invention contains the multilayer wiring structure containing at least one of the interlayer insulating film, etching stopper film, and chemical mechanical polishing stopper film formed by using the insulating film material of the invention, the lowering of the parastic capacitance between the wirings and lowing of the wiring resistance are realized, and the semiconductor device of the invention is particularly suitable for a flash memory, DRAM, FRAM, and MOS transistor of high speed and high reliability.

What is claimed is:

1. An insulating film material, comprising:
   a polycarbosilane compound expressed by the following structural formula 1:

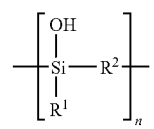

Structural Formula 1 where $R^1$ may be the same or different to each other in the unit repeated "n" times, and each represents C1-4 hydrocarbon or aromatic hydrocarbon; $R^2$ may be the same or different to each other in the unit repeated "n" times, and each represents C1-4 hydrocarbon or aromatic hydrocarbon; n is an integer of 5 to 5,000, and a silane compound, wherein the silane compound is at least one compound selected from the group consisting of vinylmethyl diethoxysilane, vinylphenyl diethoxysilane, bis(dimethylamino)diphenylsilane, 4-[2-(trichlorosilyl)ethyl]pyridine, 1,1,3,3,-tetraphenyl dimethyldisilazane, 1,1,3,3,-tetramethyl disilane and triethylsilanol.

2. The insulating film material according to claim 1, wherein the polycarbosilane compound has a weight average molecular weight of more than 400, but 10,000 or less.

3. The insulating film material according to claim 1, wherein the polycarbosilane compound expressed by the structural formula 1 has an amount of silanol groups contained therein of 1% by mass to 20% by mass, where the amount of the silanol groups is calculated by the formula: ([Si—OH]/the weight average molecular weight of the polycarbosilane compound×100).

* * * * *